United States Patent
Yamazaki et al.

(10) Patent No.: US 9,698,368 B2
(45) Date of Patent: Jul. 4, 2017

(54) DISPLAY MODULE WITH WHITE LIGHT

(71) Applicant: Semiconductor Energy Laboratory Co., Ltd., Kanagawa-ken (JP)

(72) Inventors: Shunpei Yamazaki, Tokyo (JP); Satoshi Seo, Kanagawa (JP); Hideaki Kuwabara, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/172,765

(22) Filed: Jun. 3, 2016

(65) Prior Publication Data

US 2016/0336529 A1    Nov. 17, 2016

Related U.S. Application Data

(63) Continuation of application No. 14/883,939, filed on Oct. 15, 2015, now Pat. No. 9,362,534, which is a
(Continued)

(30) Foreign Application Priority Data

Apr. 24, 2002   (JP) ................................. 2002-123188

(51) Int. Cl.
*H01L 35/24*  (2006.01)
*H01L 51/52*  (2006.01)
(Continued)

(52) U.S. Cl.
CPC ........ *H01L 51/5209* (2013.01); *G01J 1/4228* (2013.01); *H01L 25/167* (2013.01);
(Continued)

(58) Field of Classification Search
CPC ............ H01L 51/5271; H01L 51/5221; H01L 51/5206; H01L 51/529; H01L 33/60; H01L 33/62; H01L 33/24; H01L 33/20
See application file for complete search history.

(56) References Cited

U.S. PATENT DOCUMENTS 4,411,735 A    10/1983  Belani
5,047,687 A    9/1991   Vanslyke
(Continued)

FOREIGN PATENT DOCUMENTS

EP    0 717 445 A2    6/1996
EP    0 781 075 A1    6/1997
(Continued)

OTHER PUBLICATIONS

Kamins, T., *Polycrystalline Silicon for Integrated Circuits and Displays*, Second Edition, 1998, pp. 301-302, Kluwer Academic Publishers.
(Continued)

*Primary Examiner* — (Vikki) Hoa B Trinh
(74) *Attorney, Agent, or Firm* — Husch Blackwell LLP

(57) ABSTRACT

A FET is formed on a semiconductor substrate, a curved surface having a radius of curvature is formed on an upper end of an insulation, a portion of a first electrode is exposed corresponding to the curved surface to form an inclined surface, and a region defining a luminescent region is subjected to etching to expose the first electrode. Luminescence emitted from an organic chemical compound layer is reflected by the inclined surface of the first electrode to increase a total quantity of luminescence taken out in a certain direction.

21 Claims, 13 Drawing Sheets

Related U.S. Application Data continuation of application No. 14/679,357, filed on Apr. 6, 2015, now Pat. No. 9,165,987, which is a continuation of application No. 14/334,209, filed on Jul. 17, 2014, now Pat. No. 9,000,429, which is a continuation of application No. 14/147,169, filed on Jan. 3, 2014, now Pat. No. 8,785,919, which is a continuation of application No. 13/731,592, filed on Dec. 31, 2012, now Pat. No. 8,624,235, which is a continuation of application No. 12/750,325, filed on Mar. 30, 2010, now Pat. No. 8,344,363, which is a continuation of application No. 10/421,238, filed on Apr. 23, 2003, now Pat. No. 7,786,496.

(51) Int. Cl.
| | | |
|---|---|---|
| G01J 1/42 | (2006.01) | |
| H01L 25/16 | (2006.01) | |
| H01L 27/32 | (2006.01) | |
| H01L 51/00 | (2006.01) | |
| H01L 51/56 | (2006.01) | |

(52) U.S. Cl.
CPC ........ *H01L 27/322* (2013.01); *H01L 27/3211* (2013.01); *H01L 27/3246* (2013.01); *H01L 27/3258* (2013.01); *H01L 27/3262* (2013.01); *H01L 27/3276* (2013.01); *H01L 51/0096* (2013.01); *H01L 51/524* (2013.01); *H01L 51/5218* (2013.01); *H01L 51/5234* (2013.01); *H01L 51/56* (2013.01); *H01L 2227/323* (2013.01); *H01L 2251/5315* (2013.01)

(56) References Cited

U.S. PATENT DOCUMENTS

| | | |
|---|---|---|
| 5,049,780 A | 9/1991 | Dobrowolski et al. |
| 5,063,327 A | 11/1991 | Brodie et al. |
| 5,232,549 A | 8/1993 | Cathey et al. |
| 5,640,067 A | 6/1997 | Yamauchi et al. |
| 5,684,365 A | 11/1997 | Tang et al. |
| 5,714,968 A | 2/1998 | Ikeda |
| 5,718,991 A | 2/1998 | Lin et al. |
| 5,739,882 A | 4/1998 | Shimizu et al. |
| 5,742,129 A | 4/1998 | Nagayama et al. |
| 5,786,664 A | 7/1998 | Liu |
| 5,839,456 A | 11/1998 | Han |
| 5,940,053 A | 8/1999 | Ikeda |
| 5,962,962 A | 10/1999 | Fujita et al. |
| 6,011,529 A | 1/2000 | Ikeda |
| 6,037,712 A | 3/2000 | Codama et al. |
| 6,091,195 A | 7/2000 | Forrest et al. |
| 6,107,158 A | 8/2000 | Zheng et al. |
| 6,114,715 A | 9/2000 | Hamada |
| 6,194,837 B1 | 2/2001 | Ozawa |
| 6,222,315 B1 | 4/2001 | Yoshizawa et al. |
| 6,272,612 B1 | 8/2001 | Bordaz et al. |
| 6,306,559 B1 | 10/2001 | Tanamura et al. |
| 6,320,311 B2 | 11/2001 | Nakaya et al. |
| 6,380,687 B1 | 4/2002 | Yamazaki |
| 6,384,427 B1 | 5/2002 | Yamazaki et al. |
| 6,396,208 B1 | 5/2002 | Oda et al. |
| 6,403,289 B1 | 6/2002 | Tanaka et al. |
| 6,406,804 B1 | 6/2002 | Higashi et al. |
| 6,420,834 B2 | 7/2002 | Yamazaki et al. |
| 6,432,845 B1 | 8/2002 | Morozumi |
| 6,433,487 B1 | 8/2002 | Yamazaki |
| 6,441,873 B2 | 8/2002 | Young |
| 6,445,005 B1 | 9/2002 | Yamazaki et al. |
| 6,456,003 B1 | 9/2002 | Mori et al. |
| 6,462,722 B1 | 10/2002 | Kimura et al. |
| 6,475,836 B1 | 11/2002 | Suzawa et al. |
| 6,501,217 B2 | 12/2002 | Beierlein et al. |
| 6,515,310 B2 | 2/2003 | Yamazaki et al. |
| 6,518,700 B1 | 2/2003 | Friend et al. |
| 6,522,315 B2 | 2/2003 | Ozawa et al. |
| 6,528,824 B2 | 3/2003 | Yamagata et al. |
| 6,538,374 B2 | 3/2003 | Hosokawa |
| 6,538,390 B2 | 3/2003 | Fujita et al. |
| 6,552,496 B2 | 4/2003 | Yamazaki |
| 6,555,968 B2 | 4/2003 | Yamazaki et al. |
| 6,597,111 B2 | 7/2003 | Silvernail et al. |
| 6,597,121 B2 | 7/2003 | Imura |
| 6,599,783 B2 | 7/2003 | Takatoku |
| 6,605,826 B2 | 8/2003 | Yamazaki et al. |
| 6,608,353 B2 | 8/2003 | Miyazaki et al. |
| 6,608,449 B2 | 8/2003 | Fukunaga |
| 6,614,085 B2 | 9/2003 | Hu |
| 6,614,174 B1 | 9/2003 | Urabe et al. |
| 6,618,029 B1 | 9/2003 | Ozawa |
| 6,624,571 B1 | 9/2003 | Toyoyasu et al. |
| 6,628,065 B2 | 9/2003 | Araki et al. |
| 6,641,933 B1 | 11/2003 | Yamazaki et al. |
| 6,690,034 B2 | 2/2004 | Fujimoto et al. |
| 6,692,845 B2 | 2/2004 | Maruyama et al. |
| 6,699,739 B2 | 3/2004 | Yamazaki et al. |
| 6,717,181 B2 | 4/2004 | Murakami et al. |
| 6,720,572 B1 | 4/2004 | Jackson et al. |
| 6,737,306 B2 | 5/2004 | Yamazaki et al. |
| 6,739,931 B2 | 5/2004 | Yamazaki et al. |
| 6,740,457 B2 | 5/2004 | Takizawa |
| 6,750,618 B2 | 6/2004 | Yamazaki et al. |
| 6,768,534 B2 | 7/2004 | Iwase et al. |
| 6,774,573 B2 | 8/2004 | Yamazaki |
| 6,787,796 B2 | 9/2004 | Do et al. |
| 6,788,356 B2 | 9/2004 | Song |
| 6,798,132 B2 | 9/2004 | Satake |
| 6,805,977 B2 | 10/2004 | Sotoyama et al. |
| 6,831,408 B2 | 12/2004 | Hirano et al. |
| 6,839,045 B2 | 1/2005 | Ozawa et al. |
| 6,841,266 B2 | 1/2005 | Chen et al. |
| 6,853,130 B2 | 2/2005 | Morii |
| 6,858,878 B2 | 2/2005 | Yamazaki et al. |
| 6,869,635 B2 | 3/2005 | Kobayashi |
| 6,881,501 B2 | 4/2005 | Yudasaka |
| 6,894,312 B2 | 5/2005 | Yamazaki et al. |
| 6,900,470 B2 | 5/2005 | Kobayashi et al. |
| 6,933,672 B2 | 8/2005 | Hosokawa |
| 6,956,324 B2 | 10/2005 | Yamazaki |
| 6,958,490 B2 | 10/2005 | Okamoto et al. |
| 6,969,291 B2 | 11/2005 | Urabe et al. |
| 6,977,463 B2 | 12/2005 | Sato |
| 6,995,511 B2 | 2/2006 | Yamazaki et al. |
| 7,015,503 B2 | 3/2006 | Seki et al. |
| 7,098,602 B2 | 8/2006 | Yamazaki et al. |
| 7,112,374 B2 | 9/2006 | Yamazaki et al. |
| 7,138,762 B2 | 11/2006 | Morii |
| 7,138,764 B2 | 11/2006 | Koyama et al. |
| 7,180,483 B2 | 2/2007 | Kimura et al. |
| 7,187,121 B2 | 3/2007 | Hasegawa et al. |
| 7,190,111 B2 | 3/2007 | Lee et al. |
| 7,214,959 B2 | 5/2007 | Seki et al. |
| 7,221,339 B2 | 5/2007 | Ozawa et al. |
| 7,253,793 B2 | 8/2007 | Ozawa et al. |
| 7,256,422 B2 | 8/2007 | Yamazaki |
| 7,273,801 B2 | 9/2007 | Seki et al. |
| 7,291,973 B2 | 11/2007 | Ishihara et al. |
| 7,301,276 B2 | 11/2007 | Yamazaki et al. |
| 7,332,859 B2 | 2/2008 | Hasegawa et al. |
| 7,358,531 B2 | 4/2008 | Koyama |
| 7,402,945 B2 | 7/2008 | Yamazaki et al. |
| 7,402,948 B2 | 7/2008 | Yamazaki et al. |
| 7,427,832 B2 | 9/2008 | Kobayashi |
| 7,548,027 B2 | 6/2009 | Yamazaki |
| 7,579,771 B2 | 8/2009 | Yamazaki et al. |
| 7,663,305 B2 | 2/2010 | Yamazaki et al. |
| 7,786,496 B2 | 8/2010 | Yamazaki et al. |
| 8,021,204 B2 | 9/2011 | Yamazaki et al. |
| 2001/0004190 A1 | 6/2001 | Nishi et al. |
| 2001/0011868 A1 | 8/2001 | Fukunaga et al. |
| 2001/0020922 A1 | 9/2001 | Yamazaki et al. |
| 2001/0026125 A1 | 10/2001 | Yamazaki et al. |
| 2001/0026257 A1 | 10/2001 | Kimura |

(56) References Cited

U.S. PATENT DOCUMENTS

| | | |
|---|---|---|
| 2001/0054867 A1 | 12/2001 | Kubota |
| 2002/0011597 A1 | 1/2002 | Fujimoto et al. |
| 2002/0025425 A1 | 2/2002 | Kawazu |
| 2002/0025643 A1 | 2/2002 | Akram et al. |
| 2002/0039730 A1 | 4/2002 | Morii |
| 2002/0043932 A1 | 4/2002 | Kawashima |
| 2002/0050776 A1 | 5/2002 | Kubota et al. |
| 2002/0050795 A1 | 5/2002 | Imura |
| 2002/0063515 A1 | 5/2002 | Goto |
| 2002/0119606 A1 | 8/2002 | Hamada et al. |
| 2002/0121860 A1 | 9/2002 | Seo et al. |
| 2002/0138228 A1 | 9/2002 | Faulkner et al. |
| 2002/0149053 A1 | 10/2002 | Tsunoda et al. |
| 2002/0190256 A1 | 12/2002 | Murakami et al. |
| 2003/0062826 A1 | 4/2003 | Seo et al. |
| 2003/0193493 A1 | 10/2003 | Ozawa |
| 2003/0197466 A1 | 10/2003 | Yamazaki et al. |
| 2003/0201447 A1 | 10/2003 | Yamazaki et al. |
| 2003/0201716 A1 | 10/2003 | Yamazaki et al. |
| 2003/0222575 A1 | 12/2003 | Yamazaki et al. |
| 2003/0227021 A1 | 12/2003 | Yamazaki et al. |
| 2003/0231273 A1 | 12/2003 | Kimura et al. |
| 2004/0012747 A1 | 1/2004 | Yamazaki et al. |
| 2004/0171182 A1 | 9/2004 | Yamazaki et al. |
| 2004/0195964 A1 | 10/2004 | Yamazaki et al. |
| 2005/0001541 A1 | 1/2005 | Yamazaki et al. |
| 2005/0006667 A1 | 1/2005 | Yamazaki |
| 2005/0012445 A1 | 1/2005 | Yamazaki et al. |
| 2005/0073243 A1 | 4/2005 | Yamazaki et al. |
| 2005/0134171 A1 | 6/2005 | Kobayashi |
| 2005/0162092 A1 | 7/2005 | Yamazaki et al. |
| 2005/0186403 A1 | 8/2005 | Seki et al. |
| 2005/0247938 A1 | 11/2005 | Okamoto et al. |
| 2005/0248266 A1 | 11/2005 | Hosokawa |
| 2006/0014465 A1 | 1/2006 | Yamazaki |
| 2006/0017374 A1 | 1/2006 | Hasegawa et al. |
| 2006/0082300 A1 | 4/2006 | Yamazaki et al. |
| 2006/0267030 A1 | 11/2006 | Yamazaki et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2007/0007870 A1 | 1/2007 | Yamazaki et al. |
| 2007/0096641 A1 | 5/2007 | Hasegawa et al. |
| 2008/0252207 A1 | 10/2008 | Yamazaki et al. |
| 2010/0221855 A1 | 9/2010 | Yamazaki et al. |
| 2012/0086042 A1 | 4/2012 | Yamazaki et al. |
| 2012/0098013 A1 | 4/2012 | Yamazaki et al. |
| 2012/0228603 A1* | 9/2012 | Nakamura ............ H01L 27/322 257/40 |
| 2014/0299845 A1* | 10/2014 | Kim ........................ H01L 51/56 257/40 |
| 2016/0268348 A1* | 9/2016 | Ikeda .................... H01L 27/322 |

FOREIGN PATENT DOCUMENTS

| | | |
|---|---|---|
| EP | 0 895 219 A1 | 2/1999 |
| EP | 0 917 127 A1 | 5/1999 |
| EP | 0 985 952 A1 | 3/2000 |
| EP | 0 989 778 A1 | 3/2000 |
| EP | 1 065 723 A2 | 1/2001 |
| EP | 1 085 576 A2 | 3/2001 |
| EP | 1 087 448 A2 | 3/2001 |
| EP | 1 102 317 A2 | 5/2001 |
| EP | 1 191 823 A1 | 3/2002 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 619 654 A1 | 1/2006 |
| EP | 1 793 650 A2 | 6/2007 |
| EP | 1 830 342 A2 | 9/2007 |
| EP | 1 830 343 A2 | 9/2007 |
| EP | 1 830 344 A2 | 9/2007 |
| JP | 07-272859 A | 10/1995 |
| JP | 08-054836 A | 2/1996 |
| JP | 10-289784 A | 10/1998 |
| JP | 11-329741 A | 11/1999 |
| JP | 11-339970 A | 12/1999 |
| JP | 2000-077181 A | 3/2000 |
| JP | 2000-091083 A | 3/2000 |
| JP | 2000-193994 A | 7/2000 |
| JP | 2000-269473 A | 9/2000 |
| JP | 2001-043980 A | 2/2001 |
| JP | 2001-043981 A | 2/2001 |
| JP | 2001-052870 A | 2/2001 |
| JP | 2001-076868 A | 3/2001 |
| JP | 2001-148291 A | 5/2001 |
| JP | 2001-154001 A | 6/2001 |
| JP | 2001-195009 A | 7/2001 |
| JP | 2001-267086 A | 9/2001 |
| JP | 2001-338771 A | 12/2001 |
| JP | 2001-351787 A | 12/2001 |
| JP | 2002-008566 A | 1/2002 |
| JP | 2002-015860 A | 1/2002 |
| JP | 2002-071902 A | 3/2002 |
| JP | 2002-083689 A | 3/2002 |
| JP | 2002-132186 A | 5/2002 |
| JP | 2002-198182 A | 7/2002 |
| JP | 2002-208491 A | 7/2002 |
| JP | 2002-352963 A | 12/2002 |
| JP | 2003-017272 A | 1/2003 |
| JP | 2003-017273 A | 1/2003 |
| JP | 2003-133057 A | 5/2003 |
| WO | WO 99/43028 A1 | 8/1999 |
| WO | WO 99/49358 A1 | 9/1999 |
| WO | WO 01/08240 A1 | 2/2001 |
| WO | WO 01/63975 A1 | 8/2001 |

OTHER PUBLICATIONS

*Merriam-Webster's Collegiate Dictionary*, Tenth Edition , 1998, p. 653, Merriam-Webster.
*Merriam-Webster's Collegiate Dictionary*, Tenth Edition, 1998, p. 827, Merriam-Webster.
Office Action re U.S. Appl. No. 10/422,380, dated Nov. 12, 2004.

* cited by examiner

LIGHT EMITTING REGION

LIGHT EMITTING
REGION

LIGHT EMITTING REGION

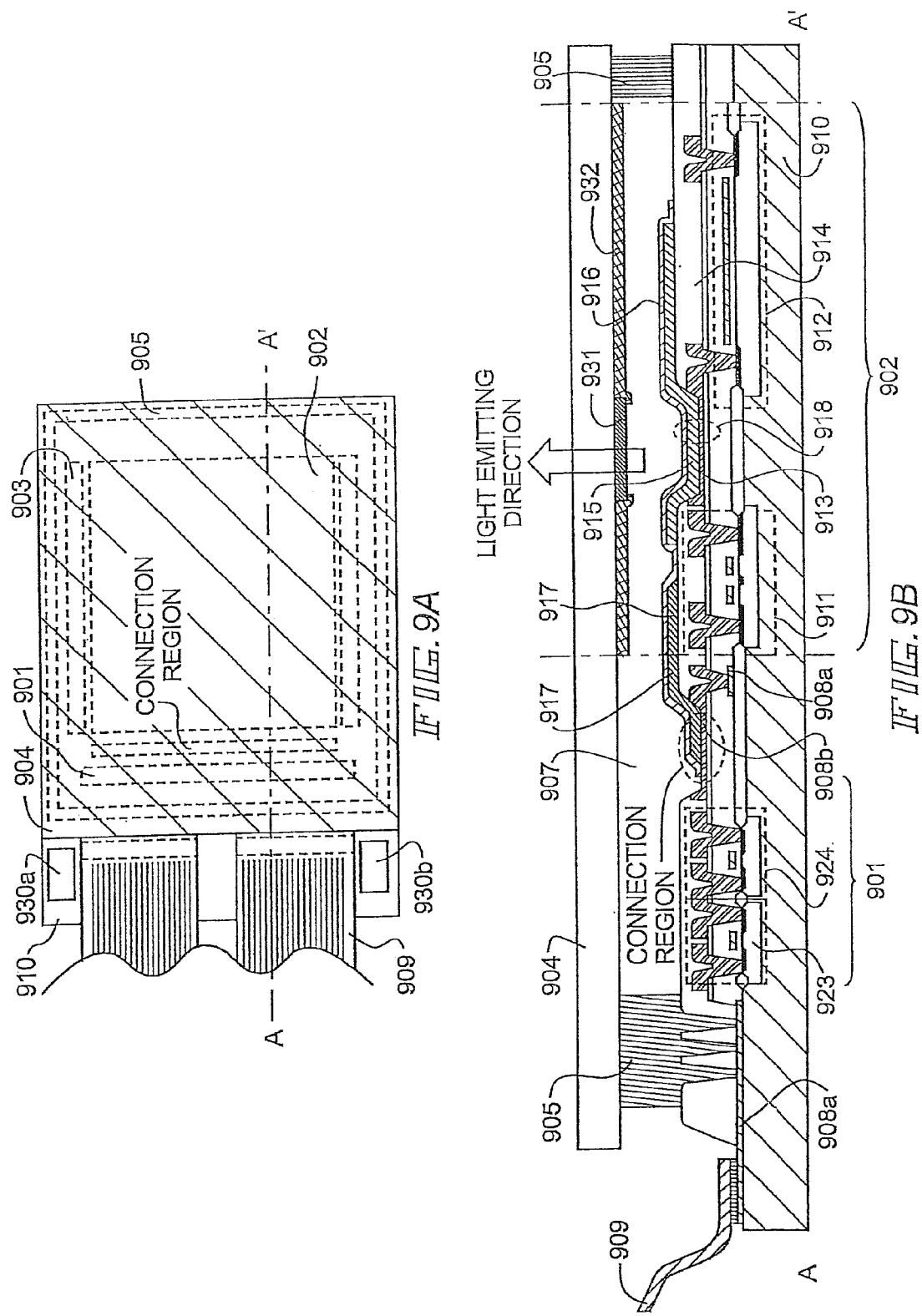

DISPLAY MODULE WITH WHITE LIGHT

This application is a continuation of copending U.S. application Ser. No. 14/883,939, filed on Oct. 15, 2015 which is a continuation of U.S. application Ser. No. 14/679, 357, filed on Apr. 6, 2015 (now U.S. Pat. No. 9,165,987 issued Oct. 20, 2015) which is a continuation of U.S. application Ser. No. 14/334,209, filed on Jul. 17, 2014 (now U.S. Pat. No. 9,000,429 issued Apr. 7, 2015) which is a continuation of U.S. application Ser. No. 14/147,169, filed on Jan. 3, 2014 (now U.S. Pat. No. 8,785,919 issued Jul. 22, 2014) which is a continuation of U.S. application Ser. No. 13/731,592, filed on Dec. 31, 2012 (now U.S. Pat. No. 8,624,235 issued Jan. 7, 2014) which is a continuation of U.S. application Ser. No. 12/750,325, filed on Mar. 30, 2010 (now U.S. Pat. No. 8,344,363 issued Jan. 1, 2013) which is a continuation of U.S. application Ser. No. 10/421,238, filed on Apr. 23, 2003 (now U.S. Pat. No. 7,786,496 issued Aug. 31, 2010), all of which are incorporated herein by reference.

BACKGROUND OF THE INVENTION

The present invention relates to a semiconductor device having a circuit composed of field effect transistors (referred below to as FET), and a method of manufacturing the same. In addition, FET referred to in the specification of the present application indicates general elements, in which the basic principle of FET is embodied as an element, and includes MIS FET, MOS FET making use of oxides for insulator films, and thin film transistors making use of semiconductor thin films. The invention specifically relates to an electronic equipment, on which a semiconductor device having a Light Emitting Diode is loaded as a part.

In addition, a semiconductor device referred to in the specification of the present application indicates devices in general making use of semiconductor characteristics to be able to function, and electro-optic devices, light emitting devices, semiconductor circuits, and electronic equipments are all indicated as semiconductor devices.

Also, semiconductor devices include all modules, in which connectors, for example, FPC (Flexible printed circuit), or TAB (Tape Automated Bonding) tape, or TCP (Tape Carrier Package), are mounted on a light emitting device, modules, in which a printed circuit board is provided on a tip end of TAB tape, or TCP, or modules, in which an IC (integrated circuit) is packaged directly on a light emitting diode by means of COG (Chip On Glass).

In recent years, light emitting devices having an EL element as a self-light emitting element have been actively studied, and in particular, attention has been paid to light emitting devices making use of organic materials as an EL material. Such a light emitting device is called an EL Display, or a Light Emitting Diode. Note that, a light emitting device referred to in the specification of the present application indicates an graphic display device, light emitting device, or a light source (includes a lighting device).

In addition, EL elements comprise a layer (referred below to as EL layer) containing an organic chemical compound, in which light emitting (Electro Luminescence) generated upon application of an electric field is obtained, anode, and cathode. While light emitting in organic chemical compounds includes emission (fluorescence) generated when returned to a ground state from a singlet excitation state, and emission (phosphorescence) generated when returned to a ground state from a triplet excitation state, light emitting devices fabricated by a deposition apparatus and a deposition method, according to the invention, are applicable to the cases where either emission is used.

light emitting devices has a feature in that there is caused no problem in angle of visibility because they are of self-light emitting type unlike liquid crystal displays. That is, the devices are more suitable than liquid crystal displays when used as displays in the open air, and use thereof has been proposed in various configurations.

While an EL element is configured such that an EL layer is interposed between a pair of electrodes, the EL layer generally has a laminated structure. Typically, a laminated structure "hole transport layer/light emitting layer/electron transport layer" is listed. This structure is very high in light emitting efficiency and adopted by almost all light emitting devices, which are presently being studied and developed.

Also, light emitting elements formed by a cathode, an EL layer, and an anode are called EL elements, and include two types, that is, a system (simple matrix system), in which an EL layer is formed between two kinds of stripe-shaped electrodes provided perpendicular to each other; and a system (active matrix system), in which an EL layer is formed between a pixel electrode connected to TFT and arranged in a matrix configuration and an opposed electrode. However, it is believed that in the case where pixels are increased in density, the active matrix system, in which switches are provided every pixel (or one dot), is advantageous.

Also, active matrix type light emitting devices have been structured, in which an electrode electrically connected to a TFT on a substrate is formed as an anode, an organic compound layer is formed on the anode, a light emitting element with a cathode formed on the organic compound layer is provided, and light generated on the organic compound layer is taken out toward a TFT from the anode being a transparent electrode.

Hereupon, according to the invention, active matrix type light emitting devices are fabricated having a light emitting element of a structure (referred below to as upper-surface outgoing structure), in which a first electrode is formed as an anode, a layer containing an organic compound layer is formed on the anode, and a cathode composed of a second electrode for transmission of emission is formed on the layer containing an organic compound layer. Alternatively, active matrix type light emitting devices are fabricated having a light emitting element of a structure, in which a first electrode is formed as a cathode, a layer containing an organic compound layer is formed on the cathode, and an anode composed of a second electrode for transmission of emission is formed on the layer containing an organic compound layer.

Also, all the light generated on the layer containing an organic compound layer is not taken out toward an observer (user) but light is emitted, for example, laterally (direction in parallel to the substrate surface), and as a result, the light emitted laterally is not taken out and so constitutes a loss. Hereupon, the invention has its object to provide a light emitting device structured to increase a quantity of light taken out in a certain direction, and a method of fabricating the same.

Also, in a light emitting element having an organic compound, let consider a path, along which electrons and holes injected from electrodes are converted into photons to be finally taken out of the element. Only a certain ratio of electric current flowing through an external circuit can contribute to carrier combination as an electron-hole pair and a portion of the electron-hole pair as recombined is consumed for generation of light emitting molecular excitons. The generated excitons are converted into photons in a ratio prescribed by fluorescence quantum efficiency, and the remainder is deactivated in various paths to make, for example, thermal deactivation and emission of infrared light. Accordingly, when such light emitting element is driven to make emission, Joule heat is generated to incur decomposition and crystallization of an organic compound layer, thus causing deterioration of the light emitting element.

SUMMARY OF THE INVENTION

Hereupon, the invention has its object to efficiently remove or reduce generation of heat in a light emitting element having an organic compound layer.

The invention comprises using a semiconductor substrate to form a FET, forming a first electrode, which constitutes an electrode (drain electrode or source electrode) of the FET and is made of a laminated of metallic layers, forming an insulation (called bank, partition) covering an end of the first electrode, thereafter performing etching of a portion of the insulation in self-alignment with the insulation as a mask and performing etching of a central portion of the first electrode to thin the area and to form a stepped portion on the end. Such etching thins the central portion of the first electrode into a flat surface, and that end of the first electrode, which is covered by the insulation, is made thick in shape, that is, concave-shaped (depression). And a layer containing an organic compound and a second electrode are formed on the first electrode to complete a light emitting element.

According to the invention, an inclined surface formed on a stepped portion of the first electrode reflects or collects lateral emission to increase a quantity of light taken out in a certain direction (direction passing through the second electrode).

Accordingly, a portion defining the inclined surface is preferably made of a light reflective metal, for example, a material having as a main component aluminum, silver, or the like, and the central portion in contact with the layer containing an organic compound is preferably made of an anode material having a large work function, or a cathode material having a small work function.

Also, the invention uses a semiconductor substrate of excellent heat dissipation to be able to efficiently remove or reduce generation of heat. Also, it is possible to form on the semiconductor substrate of the invention various circuits (drive circuit having CMOS circuit, such as an inverter circuit, NAND circuit, AND circuit, NOR circuit, OR circuit, shift register circuit, sampling circuit, D/A converter circuit, A/D converter circuit, buffer circuit, or the like, correction circuit, memory element such as CPU, SRAM, DRAM, or the like, photoelectric transducer composed of PIN connection of silicone, thin-film diode, resistive element, or the like) other than a light emitting element and a FET connected to the light emitting element at a time. In addition, it is also possible to fabricate minute patters, and besides to three-dimensionally integrate these circuits. Accordingly, it is possible to decrease an area occupied by various circuits and a drive circuit having an element, so that since an area of a frame part is made small, a whole size can be made compact further.

Also, while in the above configuration, the first electrode and the drain electrode of a FET are made unitary to reduce the total number of masks and processes, one photomask may be added to make the first electrode from a different material. Also, in order to provide for an increase in numerical aperture, two photomasks may be added to form a first electrode composed of laminated metallic layers connected to a drain electrode (or a source electrode) of a FET through an insulating film.

A constitution of the invention disclosed in the specification of the present application provides a semiconductor device comprising a light emitting element comprising a first electrode connected to a field effect transistor provided on a semiconductor substrate, an insulation covering an end of the first electrode, a layer containing an organic chemical compound and contacting with the first electrode, and a second electrode contacting with the layer, and wherein the first electrode has on an end thereof an inclined surface directed toward a center of the first electrode, and the inclined surface reflects light emitted from the layer containing an organic chemical compound.

Also, a further constitution of the invention provides a semiconductor device comprising a light emitting element comprising a first electrode connected to a field effect transistor provided on a semiconductor substrate, an insulation covering an end of the first electrode, a layer containing an organic chemical compound and contacting with the first electrode, and a second electrode contacting with the layer, and wherein a center of the first electrode is concave-shaped to have a smaller film thickness than that of the end thereof.

Also, a still further constitution of the invention provides a semiconductor device comprising a light emitting element comprising a first electrode connected to a field effect transistor provided on a semiconductor substrate, an insulation covering an end of the first electrode, a layer containing an organic chemical compound and contacting with the first electrode, and a second electrode contacting with the layer, and wherein the first electrode is of multi-layered structure and the number of lamination at a center of the first electrode is greater than that at an end thereof.

Also, the invention contrives a configuration of insulations (called bank, partition, barrier, or the like) provided between respective pixels in order to eliminate failure in coverage when an organic chemical compound layer composed of a high polymer is formed by means of a coating method. The respective configurations has a feature in that upper ends of the insulations have a curved surface, of which a radius of curvature is 0.2 µm to 3 µm. Also, the taper angle of the insulations suffices to be 35° to 55°.

The radius of curvature is provided to make favorable a covering quality for the stepped portion, so that deposition can be made even when a layer formed later and containing an organic chemical compound is very thin.

Also, in the respective constitutions, the first electrode comprises an inclined surface directed toward a center thereof and an inclination (also called taper angle) is more than 30° but less than 70°. In addition, it is necessary to appropriately set an inclination, material and film thickness of the organic chemical compound layer, or a material and film thickness of the second electrode so that light reflected by the inclined surface of the first electrode is prevented from being dispersed between the layers and becoming stray light.

Also, in the respective constitutions, the second electrode comprises a conductive film, for example, a thin metallic film, transparent conductive film, or a film of a lamination thereof, permitting permeation of light.

Also, in the respective constitutions, the first electrode is concave-shaped and formed in self-alignment with the insulation as a mask. Accordingly, no mask is added in forming a shape of the first electrode. In addition, a stepped portion (upper end of the inclined portion) of the first electrode corresponds substantially to the side of the insulation, and it is desired that an inclination of the inclined surface of the first electrode and an inclination of the side of the insulation are preferably equal to each other in view of covering the stepped portion.

Also, in the respective constitutions, the first electrode is a part of a drain electrode or a source electrode of the field effect transistor. By making a part of a drain electrode or a source electrode the first electrode, simultaneous formation is made possible and so it is possible to reduce the number of masks and processings. Alternatively, the first electrode and a drain electrode or a source electrode of the field effect transistor may be formed separately in different processings, in which case the first electrode can be made of a different material from that of a drain electrode or a source electrode of the field effect transistor.

Also, in the respective constitutions, the first electrode is an anode and the second electrode is a cathode. Alternatively, the first electrode is a cathode and the second electrode is an anode.

Also, in the respective constitutions, the layer containing an organic chemical compound is made of a white light emitting material, and combines with a color filter provided on a sealing agent, and alternatively, the layer containing an organic chemical compound is made of a monochromatic light emitting material, and combines with a color conversion layer or a color layer provided on a scaling agent.

Further, according to the invention, reduction in membrane resistance of an electrode (electrode, which light permeates) being a cathode may be achieved by using the deposition method making use of a deposition mask to form wirings (called auxiliary wirings, or a third electrode) on the insulation arranged between respective pixels after formation of a stepped portion of the first electrode. Also, the invention has a feature in that wirings taken out are formed by the use of the auxiliary wirings to be connected to other wirings present in lower layers.

Also, in the respective constitutions, the field effect transistor is a MISFET, MOSFET, or a TFT.

Also, in the respective constitutions, a CPU, memory element, thin film diode, photoelectric transducer, or a resistive element is provided on the semiconductor substrate.

Also, a constitution of the invention for materializing the respective constitutions provides a method of fabricating a semiconductor device having a light emitting element comprising an anode, a layer containing an organic chemical compound and contacting with the anode, and a cathode contacting with the layer containing an organic chemical compound, comprising the steps of forming a field effect transistor on a semiconductor substrate; forming an insulation, which covers an end of a first electrode being a part of a drain electrode or a source electrode of the field effect transistor performing etching with the insulation as a mask to thin a center of the first electrode so that an inclined surface is exposed along an edge of the first electrode, which comprises a lamination of metallic layers; forming a layer containing an organic chemical compound and contacting with the center and the inclined surface of the first electrode; and forming a second electrode, which is made of a metallic thin film permitting permeation of light, on the layer containing an organic chemical compound.

Also, in the constitution relating to the fabricating method, the first electrode comprises a lamination of a light-reflective metallic layer and a metallic layer serving as a stopper for etching, the light-reflective metallic layer is subjected to etching, and a light-reflective metallic material is exposed to the inclined surface.

Also, by subjecting the first electrode to etching, surfaces of the metallic layer serving as a stopper for etching may be somewhat subjected to etching.

Also, in the constitution relating to the fabricating method, the first electrode is an anode and made of a metallic layer having a greater work function than that of the second electrode.

Also, in the constitution relating to the fabricating method, the first electrode comprises a lamination of a first metallic layer containing titanium, second metallic layer containing titanium nitride or tungsten nitride, third metallic layer containing aluminum, and a fourth metallic layer containing titanium nitride.

In addition, since the first metallic layer contacts with a source region and a drain region of a TFT, it suffices to select a metallic material (typically, titanium), which is favorable in ohmic contact with silicone, a material having a large work function is preferable for a second metallic layer functioning as an anode, a metallic material having a high light reflectance is preferable for a third metallic layer reflecting light from a light emitting element, and a metallic material (titanium nitride, titanium) for preventing hillock and whisker of the third metallic layer and preventing mirror reflection on the third metallic layer is preferable for a fourth metallic layer.

Also, the first electrode is not limited to the four-layered structure but is not specifically limitative provided that the electrode comprises at least two layers composed of a metallic layer functioning as anode and a metallic layer having an inclined surface, which reflects light from a light emitting element.

Also, FIG. 12 indicates reflectance of an aluminum film containing a very small amount of Ti and reflectance of a MIN film (100 nm). Titanium nitride is a material capable of preventing mirror reflection. Also, when titanium nitride is used for anode, it makes little reflection, so that interference due to a return light of a light emitting element is not generated. Accordingly, even when any circularly polarized plate is not provided, a panel structure can be made.

For example, the first electrode may be of a six-layered structure composed of titanium as a first metallic layer titanium nitride as a second metallic layer, a metallic layer containing aluminum as a third metallic layer, titanium nitride as a fourth metallic layer, a metallic layer containing aluminum as a fifth metallic layer, and titanium nitride as a sixth metallic layer. The six-layered structure makes the fourth metallic layer an anode and has an inclined surface of the fifth metallic layer reflecting light of a light emitting element, and the metallic layer containing aluminum is provided below an anode, so that reduction in resistance can be achieved in the whole first electrode.

Also, in the constitution relating to the fabricating method, a metallic layer being an anode may be increased in work function by performing an ultraviolet irradiation processing (called UV ozonization) in ozone atmosphere. FIG. 13 shows results of measurement of changes in work function with UV ozonization time.

As shown FIG. 13, titanium nitride has a work function of 4.7 eV, and the work function can be made 5.05 eV by means of UV ozonization (six minutes). In addition, a tendency, in which a work function is increased, is obtained for tantalum nitride in the same manner. Also, in the constitution relating to the fabricating method, a metallic layer being an anode may be increased in work function by performing a plasma processing using one or several ones of gases such as $N_2$, $O_2$, Ar, BCl, and $Cl_2$.

Incidentally, measurement of work function shown in FIG. 13 is performed in the atmosphere and using "photo-electron spectroscopy apparatus AC-2" manufactured by Riken Keiki Company with photoelectron spectroscopy.

Also, in the case where etching is performed with the insulation as a mask and plasma etching is used in a processing, in which a center of the first electrode is thinned so as to expose the inclined surface along an edge of the first electrode, a metallic layer being an anode can be increased in work function depending upon an etching gas simultaneously with thinning of the center.

Also, in the constitution relating to the fabricating method, the insulation covering the end of the first electrode has a curved surface having a radius of curvature at an upper end thereof and the radius of curvature is 0.2 μm to 0.3 μm.

Also, in the constitution relating to the fabricating method, the field effect transistor is a MISFET, MOSFET, or a TFT.

In addition, EL elements comprise a layer (referred below to as EL layer) containing an organic chemical compound, in which light emitting (Electro Luminescence) generated upon application of an electric field is obtained, anode, and cathode. While light emitting in organic chemical compounds includes emission (fluorescence) when returned to a ground state from a singlet excitation state, and emission (phosphorescence) when returned to a ground state from a triplet excitation state, light emitting devices fabricated by a manufacturing apparatus and a deposition method, according to the invention, are applicable to the cases where either emission is used.

While a light emitting element (EL element) having an EL layer is configured such that the EL layer is interposed between a pair of electrodes, the EL layer ordinarily has a laminated structure. Typically, a laminated structure "hole transport layer/light emitting layer/electron transport layer" proposed by Tang of Kodak Eastman Company is listed. This structure is very high in light emitting efficiency and adopted by almost all light emitting devices, which are presently being studied and developed.

Also, a hole injection layer/hole transport layer/light emitting layer/electron transport layer or a hole injection layer/hole transport layer/light emitting layer/electron transport layer/hole injection layer may be laminated in this order on an anode. A fluorescent pigment or the like may be doped on a light emitting layer. Also, all these layers may be formed from a low molecular material, or a high polymer material. In addition, all layers provided between a cathode and an anode are referred generally to EL layers. Accordingly, all the hole injection layer, the hole transport layer, the light emitting layer, the electron transport layer and the hole injection layer are included in EL layers.

Also, with the light emitting device of the invention, a driving method in screen display is not specifically limitative but may adopt, for example, dot sequential driving method, line sequential driving method, surface sequential driving method and so on. Typically, it suffices that the line sequential driving method be adopted, and a time sharing gradation driving method and a area gradation driving method be appropriately used. Also, an image signal being input into a source wiring of the light emitting device may be an analog signal or a digital signal, and it suffices that a driving circuit be appropriately designed in conformity with an image signal.

BRIEF DESCRIPTION OF THE DRAWINGS

FIGS. 9A and 9B are views showing an example 3.

DETAILED DESCRIPTION OF PREFERRED EMBODIMENTS

Embodiments of the invention will be described below.

First Embodiment

Figure 1A:
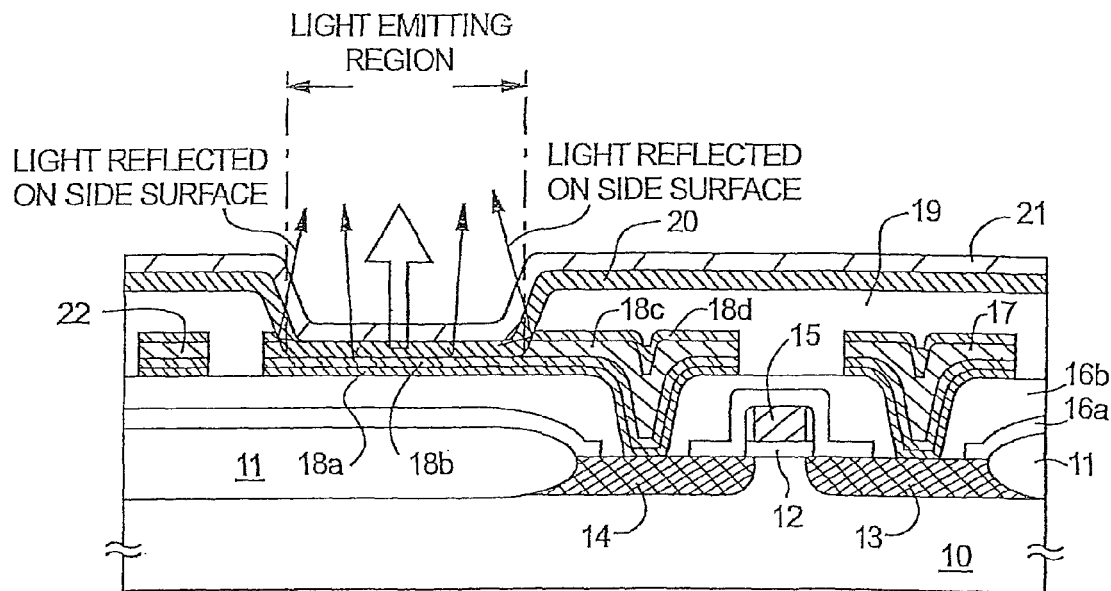
FIGS. 1A and 1B are views showing a first embodiment.

FIG. 1A is a cross sectional view showing an active matrix type light emitting device (a portion of a pixel). Here, an explanation will be exemplarily given to a light emitting element, in which a layer containing an organic compound composed of a white light emitting polymeric material.

In FIG. 1A, a FET (PMOSFET) provided on a semiconductor substrate 10 is an element for controlling an electric current flowing to a white light emitting layer 20, the reference numerals 13, 14 denoting source regions or drain regions.

A N-type or P-type single crystal silicon substrate ((100) substrate, (110) substrate, (111) substrate, or the like), or a high purity semiconductor substrate can be used for a semiconductor substrate 10. Also, for example, a wafer (circular) having a diameter of 200 mm to 300 mm is cut to make a rectangular substrate, and then a FET is formed thereon. Alternatively, multiple patterning may be performed, in which the wafer is divided into sections of a desired size after a FET and a light emitting element are formed. Also, a chemical compound semiconductor substrate typified by a GaAs substrate, InP substrate, GaN substrate for GaN system epitaxis, SiC substrate, sapphire substrate, ZnSe, or the like may be used for the semiconductor substrate 10. Also, a SOI (Si on Insulator) substrate structure may be formed by means of the wafer applying method and the SIMOX (separation by implanted oxygen) method.

A field oxide film 11 is formed on the semiconductor substrate 10, and a gate insulating film 12 is provided below a gate electrode 15. While an example, in which a side wall is formed laterally of the gate electrode 15, it is not limitative. The field oxide film 11 is formed on an opening by using the selective oxidation method (also called LOCOS method) for separation of respective elements to perform thermal oxidation of the semiconductor substrate to form an oxide film (pad oxide film), using the CVD method to deposit a mask nitride film on the oxide film, performing patterning, exposing a silicone surface only to the opening to perform thermal oxidation.

Also, trench separation, in which design rule is suited to fine processing of at most 0.25 µm, may be used in place of the LOCOS method. The trench separation is a method of performing element separation by refilling an insulating material such as oxide film, or the like, into grooves after the grooves (trenches) are formed on a silicone substrate.

Also, the reference numeral 16*a* denotes an interlayer insulating film composed of a silicon nitride film and a silicon nitride and oxide film, and the reference numeral 16*b* denotes a flattened insulating film composed of a photosensitive or non-photosensitive organic material (polyimide, acrylic, polyamide, polyimideamide, resist, or benzocyclobutene) formed by the coating method, or a flattened insulating film (containing a coated silicon oxide film, PSG (phosphorus adding glass, BPSG (boron and phosphorus adding glass), or the like) composed of an inorganic material, or a laminated film thereof. Also, although not shown, a single FET (NMOS or PMOS) or a plurality of FETs are provided on a single pixel. In the case where NMOS and PMOS are formed on the same semiconductor substrate, there is a need of providing a region (well) having a different conductivity from that of the substrate, methods therefor including the P well system, in which a P well is formed on a N type substrate, a N channel transistor is formed on the P well, and a P channel transistor is formed on the N type substrate, the N well system, in which a N well is formed on a P type substrate, a P channel transistor is formed on the N well, and a N channel transistor is formed on the P type substrate, and the twin well system, in which a N well and a P well are formed on a N type or P type substrate, a P channel transistor is formed on the N well, and a N channel transistor is formed on the P well. Also, while there is shown a FET having one channel forming region, this is not limitative, and a FET may have a plurality of channels.

Also, the reference numerals 18*a* to 18*d* denote a first electrode, that is, an anode (or cathode) of a light emitting element, and 21 denotes a second electrode, that is, a cathode (or an anode) of the light emitting element. Here, a titanium film 18*a*, titanium nitride film 18*b*, film 18*c* containing aluminum as a main component, and a titanium nitride film 18*d* are laminated in this order, and the film 18*b* contacting with a layer 20 containing an organic compound functions as an anode. Also, a power supply line 17 is formed in the same laminated structure. The laminated structure contains the film containing aluminum as a main component and can be made a wiring of low resistance, and a source wiring 22 and the like are formed at the same time.

Also, in order to provide for white light emitting, after a poly (ethylenedioxythiophene)/poly (styrenesulfonic acid) aqueous solution (PEDOT/PSS) acting as a hole injection layer is applied on a whole surface to be baked, a polyvinyl carbazole (PVK) solution doped with a light emitting center pigment (1,1,4,4-tetraphenyl-1, 3-butadiene (TPB), 4-dicyanomethylene-2-methyl-6-(p-dimethylamino-styryl)-4H-bilane (DCM1), Nile red, coumarin 6, or the like) acting as a light emitting layer is applied as the layer 20, containing an organic compound, on a whole surface to be baked. In addition, the PEDOT/PSS uses water as a solvent and is not dissolved in an organic solvent. Accordingly, when the PVK is applied thereon, there is no fear of redissolution. Also, since the PEDOT/PSS and the PVK are different in solvent from each other, it is preferable that the same deposition chamber is not used. Also, the layer 20 containing an organic compound can be made a monolayer, and a 1, 3, 4-oxadiazole derivative (PBD) of electron transport property may be dispersed in polyvinyl carbazole (PVK) of hole transport property. Also, white light emitting can be obtained by dispersing a 30 wt % PBD as an electron transport agent and dispersing suitable amounts of pigments of four kinds (TPD, coumarin 6, DCM1, Nile red).

Also, white light emitting can be obtained as a whole by appropriately selecting a film containing a red light emitting organic compound, film containing a green light emitting organic compound, and a film containing a blue light emitting organic compound, and overlapping them for color mixture.

Also, after the deposition method is used to form $CaF_2$ having a film thickness of 1 nm to 10 nm, the sputtering method or deposition method is used to finally form an Al film having a film thickness of about 10 nm to have an electrode 21 functioning as a cathode. For the cathode, it is necessary to appropriately select a film thickness and a material to permit passage of light from the layer 20 containing an organic compound. In addition, a cathode referred to in the specification of the present application is defined to indicate not only a monolayer made of a material having a small work function but also a laminated film composed of a thin film made of a material having a small work function and a conductive film.

When an Al film is used as the second electrode 21, a material contacting with the layer 20 containing an organic compound can be made of one other than an oxide, and so the light emitting device can be improved in reliability. In addition, a transparent conductive film (ITO (indium oxide stannic oxide alloy), indium oxide zinc oxide ($In_2O_3$—ZnO), zinc oxide (ZnO), or the like) may be used for the second electrode 21 in place of an Al film. Also, $CaF_2$ may be replaced by a thin metallic layer (typically, an alloy such as MgAg, MgIn, AlLi, or the like).

Also, both ends of the first electrode and a portion therebetween are covered with an insulation 19 (called barrier or bank). In the invention, a cross sectional shape of the insulation 19 is essential. Etching processing for formation of the insulation 19 forms a concave shape of the first electrode 18. In the case where no curved surface is provided on an upper end of the insulation 19, failure in deposition, in which a projection is formed on the upper end of the insulation 19, becomes liable to be generated. Hereupon, according to the invention, a curved surface having a radius of curvature is formed on the upper end of the insulation 19, a part of the first electrode 18*c*, 18*d* is exposed corresponding to the curved surface to form an inclined surface, and the etching processing is carried out so as to cause the first electrode 18*b* to be exposed to a region making a light emitting region. Also, a processing (CMP processing, or the like) for flattening a surface of the exposed first electrode 18*b* may be carried out. Also, the etching processing may be carried out so as to increase a film thickness of the first electrode 18*b* and to make a part of the first electrode 18*b* an inclined surface. In addition, the radius of curvature is preferably 0.2 µm to 0.3 µm. According to the invention, coverage for the organic compound film and the metallic film can be made favorable. Also, both a taper angle at the side of the insulation 19 and a taper angle at the inclined surface of the first electrode 18*c*, 18*d* suffice to be 45°±10°.

In addition, the processing for performing etching for the concave shape of the first electrode is not specifically limitative, and dry etching, or wet etching, or an etching method composed of a combination thereof may be adopted. The film can be etched into a desired tapered shape by using, for example, the ICP (Inductively Coupled Plasma) etching method and appropriately adjusting the etching conditions (electric energy applied to the coil type electrode, electric energy applied to the electrode on a substrate side, temperature of the electrode on the substrate side, or the like). In addition, a chlorinated gas typified by $Cl_2$, $BCl_3$, $SiCl_4$, $CCl_4$, or the like, or a fluorochemical gas typified by $CH_4$, $SF_6$, $NF_3$, or the like, or $O_2$ can be used appropriately. Here, RF (13.56 MHz) electric power of 450 W is made on the coil type electrode at pressure of 1.9 Pa, RF (13.56 MHz) electric power of 100 W is also made on the substrate (specimen stage) side, and a substantially negative self-bias voltage is applied. In addition, the electrode on the substrate side is sized to have an area of 12.5 cm×12.5 cm, and the coil type electrode (here, quartz disk provided with a coil) is a disk sized to have an area of 25 cm in diameter. The shape of the first electrode and the insulation can be formed by using $BCl_3$ and $Cl_2$ for the etching gas and making flow ratios of the respective gases 60/20 (sccm).

Also, a three-layers structure suffices, for example, a titanium film 18a, titanium nitride film 18b, and a film 18c containing aluminum as a main component may be laminated in this order.

The invention has a feature in that a light emitting from the organic compound layer 20 is reflected by the inclined surface of the first electrode 18c, 18d to increase a total quantity of light taken out in a direction indicated by the arrows in FIG. 1A.

Figure 1B:
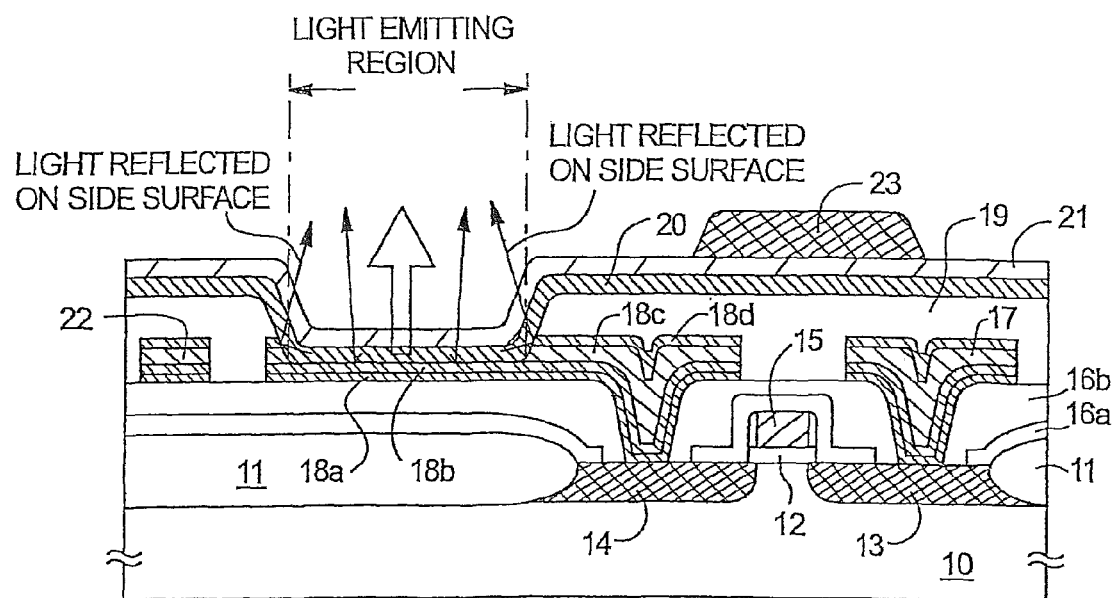

Also, as shown in FIG. 1B, a auxiliary electrode 23 may be provided on the conductive film 21 in order to attain a low resistance in the conductive film (cathode) 21. The auxiliary electrode 23 suffices to be selectively formed by the deposition method, in which a deposition mask is used.

Also, although not shown, it is preferable to form a protective film on the second electrode 21 in order to enhance reliability in the light emitting device. The protective film is a thin film having as its main component an insulating film, which has, as its main component, silicon nitride and silicon nitride and oxide obtained by the sputtering method (DC system, RF system), or a thin film having as its main component carbon. A silicon nitride film is obtained by the use of a silicon target and formation in an atmosphere containing nitrogen and argon. Also, a silicon nitride target may be used. Also, the protective film may be formed by the use of a deposition device, in which remote plasma is used. Also, in order to have a light emitting passing through the protective film, it is preferable that a film thickness of the protective film be as thin as possible.

The invention has a feature in that the thin film having as its main component carbon is a DLC (Diamond like Carbon) having a film thickness of 3 to 50 nm. The DLC film has a $SP^3$ coupling as a coupling between carbon in short-distance order but an amorphous structure macroscopically. The DLC film has a composition of carbon of 70 to 95 atom % and hydrogen of 5 to 30 atom %, the film being very hard and excellent in insulating property. Also, such DLC film has a feature in that gas permeability for water vapor, oxygen, or the like is low. Also, it has been known that such film has the hardness of 15 to 25 GPa in measurement with a micro hardness meter.

The DLC film can be formed by the use of the plasma CVD method (typically, the RF plasma CVD method, the microwave CVD method, the electron cyclotron resonance (ECR) CVD method, or the like), the sputtering method, or the like. Whichever deposition method is used, it is possible to form a DLC film with good adhesion. Deposition of the DLC film is made while mounting a substrate on a cathode. Alternatively, a minute and hard film can be formed by application of a negative bias and utilization of ion bombardment to some extent.

Deposition is carried out by using hydrogen gas and hydrocarbon gas (for example, $CH_4$, $C_2H_2$, $C_6H_6$, or the like) as a reactant gas for use in deposition, causing ionization with glow discharge, and accelerating and causing ions to strike against a cathode, on which negative self-bias is applied. Thus it is possible to obtain a minute and hard DLC film. In addition, the DLC film is an insulating film being transparent or translucent for visible light.

In the specification of the present application, being transparent for visible light indicates that transmissivity for visible light is 80 to 100%, and being translucent for visible light indicates that transmissivity for visible light is 50 to 80%.

Also, while a top gate type TFT has been described herein as an example, the invention is applicable irrespective of the TFT structure, and applicable to, for example, a bottom gate type (rearward stagger type) TFT and a forward stagger type TFT.

Second Embodiment

Figure 5A:
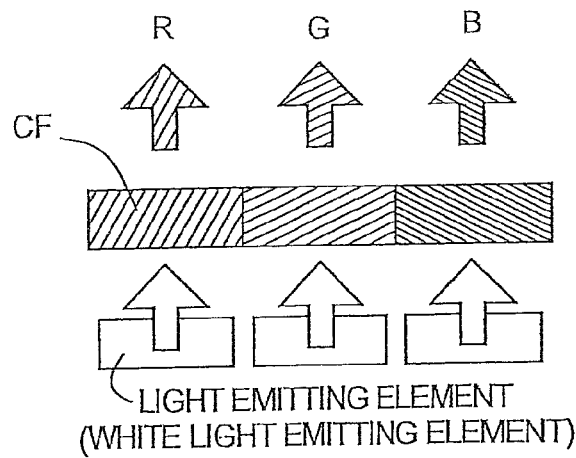
FIGS. 5A to 5C are views showing a second embodiment.

An explanation will be given below in FIG. 5A to a method (referred below to as color filter method), in which a white light emitting element and a color filter are combined together.

The color filter method is a system, in which red, green, and blue light emitting are obtained by forming a light emitting element having an organic chemical compound presenting white light emitting and passing the obtained white light emitting through a color filter.

There are various methods, by which white light emitting is obtained, and an explanation will be given here to the case where a light emitting layer made of a polymeric material and being formable by coating is used. In this case, doping of a pigment on a polymeric material making the light emitting layer can be carried out by solution adjustment and the layer can be extremely easily obtained as compared with a deposition method, in which codeposition for doping of a plurality of pigments is performed.

Concretely, formed on an anode made of a metal having a large work function (Pt, Cr, W, Ni, Zn, Sn, In) is a cathode formed by laminating a thin film containing a metal (Ii, Mg, Cs) having a small work function and a transparent conductive film (ITO (indium oxide stannic oxide alloy), indium oxide zinc oxide alloy ($In_2O_3$—ZnO), zinc oxide (ZnO), or the like) after a polyvinyl carbazole (PVK) solution doped with a luminescence center pigment (1,1,4,4-tetraphenyl-1, 3-butadiene (TPB), 4-dicyanomethylene-2-methyl-6-(p-dimethylamino-styryl)-4H-bilane (DCM1), Nile red, coumarin 6, or the like) acting as a light emitting layer is applied on a whole surface to be baked, after a poly (ethylenedioxythiophene)/poly (styrenesulfonic acid) aqueous solution (PEDOT/PSS) acting as a hole injection layer is applied on a whole surface to be baked. In addition, PEDOT/PSS uses water as a solvent and so will not be dissolved in an organic solvent. Accordingly, when the PVK is applied thereon, there is no fear of redissolution. Also, since the PEDOT/PSS and the PVK are different in solvent from each other, it is preferable that the same deposition chamber is not used.

Also, while there is shown above the example, in which the organic chemical compound layer is laminated, the organic chemical compound layer can be made a monolayer. For example, a 1,3,4-oxadiazole derivative (PBD) of electron transport property may be dispersed in polyvinyl carbazole (PVK) of hole transport property. Also, white light emitting can be obtained by dispersing a 30 wt % PBD as an electron transport agent and dispersing suitable amounts of pigments of four kinds (TPD, coumarin 6, DCM1, Nile red).

In addition, the organic chemical compound layer is formed between an anode and a cathode, and holes injected from the anode and electrons injected from the cathode are rejoined together in the organic chemical compound layer to provide for white light emitting on the organic chemical compound layer.

Also, white light emitting can be obtained as a whole by appropriately selecting a red light emitting organic chemical compound layer, a green light emitting organic chemical compound layer, and a blue light emitting organic chemical compound layer, and overlapping them for color mixture.

The organic chemical compound layer formed in the above manner is able to provide for white light emitting as a whole.

White light emitting from a light emitting element can be separated and obtained as red light emitting, green light emitting, and blue light emitting by forming a color filter provided with a color layer (R), which absorbs a light emitting except red light emitting, a color layer (G), which absorbs a light emitting except green light emitting, a color layer (B), which absorbs a light emitting except blue light emitting, respectively, in a direction, in which the organic chemical compound layer produces white light emitting. Also, in the case of an active matrix type, TFT is configured to be formed between a substrate and a color filter.

Also, a oblique mosaic arrangement, triangular mosaic arrangement, RGBG four pixel arrangement, or RGBW four pixel arrangement as well as a simplest stripe pattern can be used for the color layer (R, G, B).

Color layers constituting a color filter are formed making use of a color resist made of an organic photosensitive material, in which pigments are dispersed. In addition, white light emitting has chromaticity coordinates (x, y)=(0.34, 0.35). Color reproducibility for full color can be adequately ensured by combining white light emitting with a color filter.

In addition, in this case, there is no need of individually coating an organic chemical compound layer every color of light emitting because all films are formed by the organic chemical compound layer, which presents white light emitting, even when colors of light emitting thus obtained are different from one another. Also, any circularly polarized plate for prevention of mirror reflection is not specifically necessary.

Figure 5B:
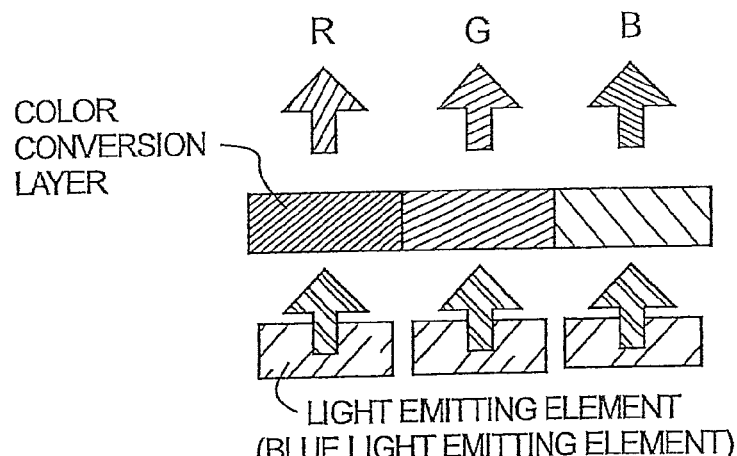

With reference to FIG. 5B, an explanation will be given below to the CCM method (color conversion mediums) realized by the combination of a blue light emitting element having an organic chemical compound layer of blue light emitting and a color conversion layer of fluorescence.

The CCM method excites color conversion layers of fluorescence with blue light emitting outgoing from a blue light emitting element and performs color conversion on the respective color conversion layers. Concretely, conversion of blue to red (B→R) is performed on the color conversion layer, conversion of blue to green (B→G) is performed on the color conversion layer, and conversion of blue to blue (B→B) is performed on the color conversion layer (In addition, conversion of blue to blue is unnecessary), thus obtaining red, green, and blue light emitting. With the CCM method, TFT is configured to be formed between a substrate and a color conversion layer to form an organic chemical compound layer in the case of an active matrix type.

In addition, there is no need of individually coating color conversion layers in this case. Also, any circularly polarized plate for prevention of mirror reflection is not specifically necessary.

Figure 5C:
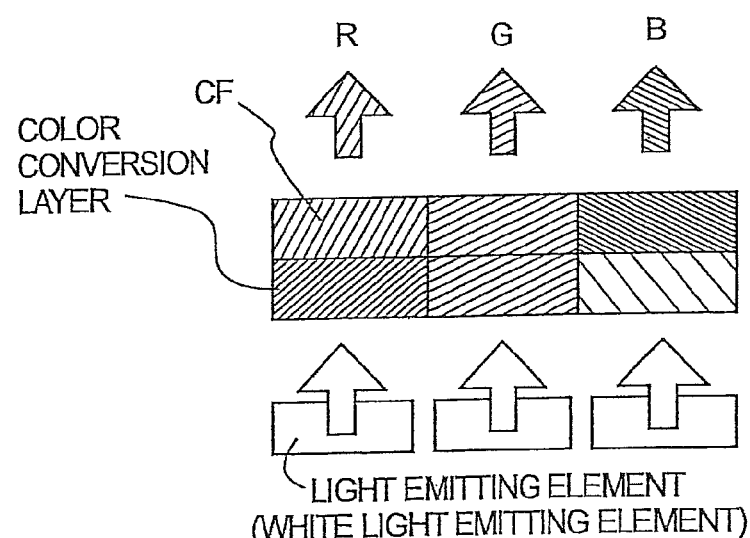

Also, since there is caused a problem in use of the CCM method that color conversion layers are excited by outdoor daylight due to fluorescence to be lowered in contrast, contrast is preferably increased by mounting of color filters as shown in FIG. 5C.

Also, the embodiment can be combined with the first embodiment.

Third Embodiment

Figure 4:
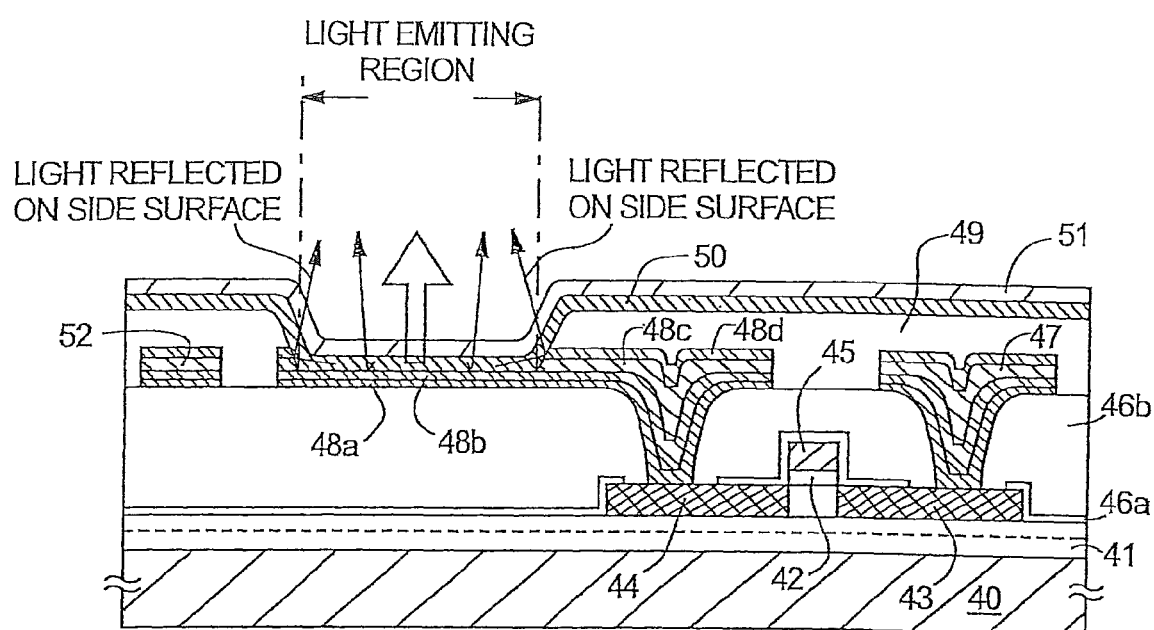
FIG. 4 is a view showing a third embodiment.

FIG. 4 shows an example, in which a base insulating film is formed on a semiconductor substrate and a TFT being a kind of FET is formed on the film.

A N type or P type single crystal silicon substrate ((100) substrate, (110) substrate, (111) substrate, or the like), or a high purity semiconductor substrate can be used for a semiconductor substrate 40. Also, for example, a wafer (circular) having a diameter of 200 mm to 300 mm is cut to make a rectangular substrate, and then a FET is formed thereon. Alternatively, multiple patterning may be performed, in which the wafer is divided into sections of a desired size after a FET and a light emitting element are formed. Also, a chemical compound semiconductor substrate typified by a GaAs substrate, InP substrate, GaN substrate for GaN system epitaxis, SiC substrate, sapphire substrate, ZnSe, or the like may be used for the semiconductor substrate 40. Also, a SOI (Si on Insulator) substrate structure may be formed by means of the wafer applying method and the SIMOX (separation by implanted oxygen) method. This semiconductor substrate 40 is for dispersing the heat generated by the light emitting element.

First, a base insulating film 41 is formed on the semiconductor substrate 40.

The plasma CVD method is used to form, as a first layer of the base insulating film 41, a silicon nitride and oxide film of 10 to 200 nm (preferably, 50 to 100 nm) deposited with $SiH_4$, $NH_3$ and $N_2O$ as reactant gas. Here, a silicon nitride and oxide film (composition ratio of Si=32%, O=27%, N=24%, H=17%) having a film thickness of 50 nm is formed. Subsequently, the plasma CVD method is used to form, as a second layer of the base insulating film 41, a silicon nitride and oxide film of 50 to 200 nm (preferably, 100 to 150 nm) deposited with $SiH_4$ and $N_2O$ as reactant gas. Here, a silicon nitride and oxide film (composition ratio of Si=32%, O=59%, N=7%, H=2%) having a film thickness of 100 nm is formed. While a two-layered structure is used as the base insulating film 41 in the example, a structure may be used, in which single or two layers of the insulating film are laminated.

Subsequently, a semiconductor layer is formed on the insulating film. A semiconductor layer constituting an active layer of a TFT is formed by depositing a semiconductor film having an amorphous structure by means of known measures (the sputtering method, LPCVD method, plasma CVD method, or the like) and thereafter patterning that crystal semiconductor film, which is obtained by a known crystallization processing (laser crystallization method, thermal crystallization method making use of a catalyst such as nickel, or the like), into a desired configuration. The semiconductor layer is formed to have a thickness of 25 to 80 nm (preferably 30 to 60 nm). The crystal semiconductor film is not limited in terms of a material but preferably formed from silicone, silicon-germanium alloy, or the like.

Also, in the case where the crystal semiconductor film is formed by means of the laser crystallization method, it is possible to use pulsed oscillation type or continuous emission type excimer laser, YAG laser, and YVO$_4$ laser. In the case where such laser is used, it is preferable to use a method, in which laser radiation emitted from a laser oscillator is linearly collected by an optical system to be irradiated on a semiconductor film. While conditions of crystallization are selected by an operator, they adopt the frequency of pulsed oscillation of 30 Hz and the laser energy density of 100 to 400 mJ/cm$^2$ (typically, 200 to 300 mJ/cm$^2$) when excimer laser is used. When YAG laser is used, they preferably adopt the frequency of pulsed oscillation of 1 to 10 kHz using its second harmonic and the laser energy density of 300 to 400 mJ/cm$^2$ (typically, 350 to 500 mJ/ccm$^2$). And laser radiation linearly collected to have a width of 100 to 1000 μm, for example, 400 μm may be irradiated over the whole substrate with the overlapping ratio of linear laser radiation being 80 to 98%.

Subsequently, surfaces of the semiconductor layer are cleaned with an etchant, which contains hydrofluoric acid, to form a gate insulating film covering the semiconductor layer. The gate insulating film is formed by means of the plasma CVD method or the sputtering method to have a thickness of 40 to 150 nm and contain silicone. In the example, the plasma CVD method is used to form the film from a silicon nitride and oxide film (composition ratio of Si=32%, O=59%, N=7%, H=2%) having a thickness of 115 nm. Of course, the gate insulating film is not limited to a silicon nitride and oxide film but other insulating film containing silicone may be used in a single layer or laminated structure.

Subsequently, a gate electrode 45 is formed after surfaces of the gate insulating film are cleaned. Subsequently, the gate insulating film is subjected to etching with the gate electrode as a mask to form a gate insulating film 42.

Subsequently, an impurities element (B, or the like) imparting p type to a semiconductor, boron is appropriately added to form a source region 43 and a drain region 44. After the addition, a heating processing, irradiation of intense light, or irradiation of laser radiation is performed to activate the impurities element. Also, plasma damage to the gate insulating film 42 and plasma damage to an interface between the gate insulating film 42 and a semiconductor layer can be recovered simultaneously with activation.

In the subsequent processings, the PCVD method is used to form an interlayer insulating film 46*a* made of a silicon nitride film and a silicon nitride and oxide film, and an interlayer insulating film 46*b* using a flattened insulating film composed of a photosensitive or non-photosensitive organic material (polyimide, acrylic, polyamide, polyimideamide, resist, or benzocyclobutene) formed by the coating method, or a flattened insulating film (containing a coated silicon oxide film, PSG (phosphorus adding glass, BPSG (boron and phosphorus adding glass), or the like) composed of an inorganic material, or a laminated film thereof. Subsequently, after hydrogenation, a contact hole reaching the source region or the drain region is formed. Subsequently, a source electrode (wiring) 52, insulation 49, power supply line 47, and first electrodes (drain electrodes) 48*a* to 48*d* are formed to complete a TFT (p channel type TFT) in the same manner as in the first embodiment.

The subsequent processings are the same as those as in the first embodiment, and so it suffices to form a layer 50 containing an organic chemical compound layer and a second electrode 51 made of a conductive film in accordance with the first embodiment.

Also, the embodiment can be freely combined with the first embodiment or the second embodiment.

The invention constituted in the above manner will be described in further detail with reference to the following examples.

EXAMPLES

Example 1

Figure 2A:
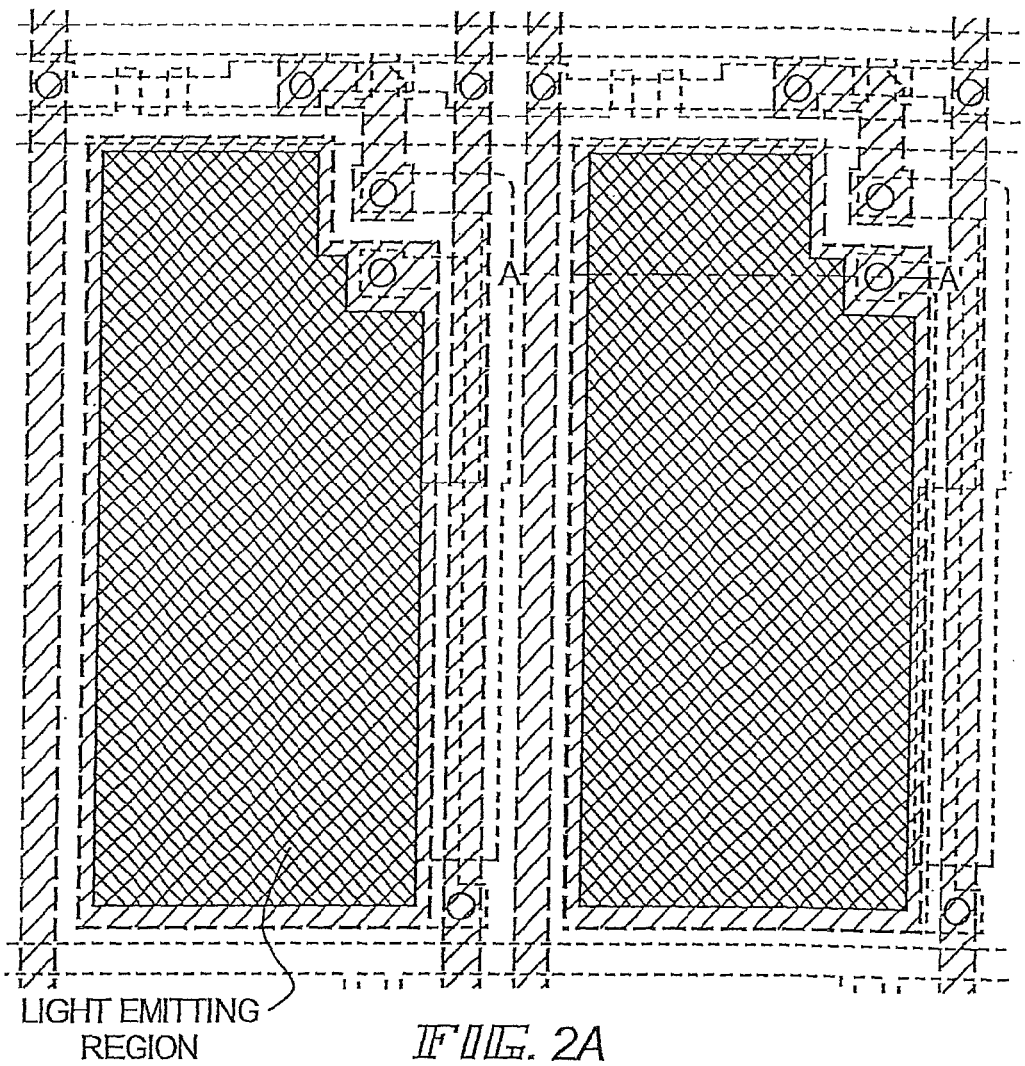
FIGS. 2A and 2B are views showing an example 1.

In this example, the procedure of formation of a light emitting element according to the invention will be briefly described by way of example with reference to FIGS. 2 and 3.

First, a known technique is used to form a MOSFET on a semiconductor plate 30. With the use of the known technique, separation of elements is performed by a field oxide film 31, and a doping processing is performed to form a drain region 32 or a source region 3.

Also, an interlayer insulating film 33 composed of a silicon nitride film and a silicon nitride and oxide film is formed by means of the PCVD method, and an interlayer insulating film 35 is formed by using a flattened insulating film composed of a photosensitive or non-photosensitive organic material (polyimide, acrylic, polyamide, polyimideamide, resist, or benzocyclobutene) formed by the coating method, or a flattened insulating film (containing a coated silicon oxide film, PSG (phosphorus adding glass, BPSG (boron and phosphorus adding glass), or the like) composed of an inorganic material, or a laminated film thereof.

After hydrogenation, a contact hole reaching the source region or the drain region is formed. Subsequently, a source electrode (wiring) and first electrodes (drain electrodes) are formed to complete a TFT (p channel type TFT).

Figure 3A:
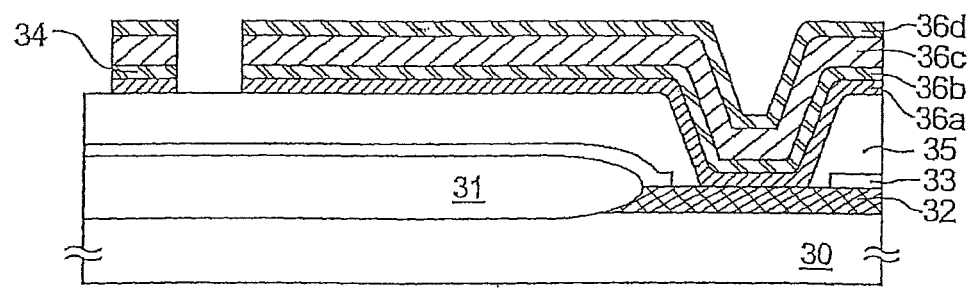
FIGS. 3A to 3C are views showing an example 1.

In the above processings, a MOSFET (here, only the drain region 32 is shown), interlayer insulating film 33, 35, and first electrodes 36*a* to 36*d* are formed (FIG. 3A).

It suffices in the example that a film containing as its main component an element selected from Ti, TiN, TiSi$_x$N$_y$, Al, Ag, Ni, W, WSi$_x$, WN$_x$, WSi$_x$T$_y$, Ta, TaN$_x$, TaSi$_x$N$_y$, NbN, MoN, Cr, Pt, Zn, Sn, In, or Mo, or an alloy material containing, as its main component the element, or a chemical compound material, or a lamination of such films be used in the range of 100 nm to 1 μm for the first electrodes 36*a* to 36*d*.

In particular, the first electrode 36*a* is preferably made of a material, typically, titanium, which is capable of ohmic contact with silicone, to be in the range of a film thickness of 10 to 100 nm. Also, the first electrodes 36*b* is preferably made of a material (TiN, TaN, MoN, Pt, Cr, W, Ni, Zn, Sn) having a large work function in the case of a thin film, and suffices to range in film thickness from 10 to 500 nm. Also, the first electrodes 36*c* is preferably made of a light-reflective metallic material, typically, a metallic material containing as its main component Al or Ag, and suffices to range in film thickness from 100 to 600 nm. In addition, the first electrodes 36*b* also functions as blocking layer for preventing alloying of the first electrodes 36*c* and the first electrode 36*a*. Also, the first electrodes 36*d* is preferably made of a material, typically, metal nitride (TiN, WN, or the like), for prevention of oxidation, prevention of corrosion, or prevention of hillock of the first electrodes 36*c*, and suffices to range in film thickness from 20 to 100 nm. In addition, the first electrodes 36*d* may be omitted.

Also, the first electrodes 36*a* to 36*d* can be formed simultaneously with other wirings, for example, a source wiring 34, power supply line, or the like.

Figure 3B:
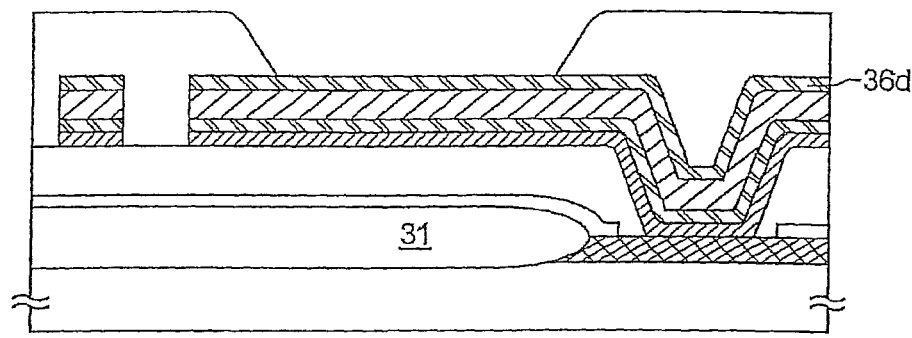

Subsequently, an insulation (called bank, partition, barrier, or the like) is formed to cover an end (portion contacting with the drain region 32) of the first electrode (FIG. 3B). While an inorganic material (silicon oxide, silicon nitride, silicon oxide and nitride, or the like), a photosensitive or non-photosensitive organic material (polyimide, acrylic, polyamide, polyimideamide, resist, or benzocyclobutene), or a lamination of these materials, or the like can be used to make the insulation, a photosensitive organic resin is used in the example. For example, when a positive type photosensitive acrylic is used as a material for the insulation, a curved surface having a radius of curvature is preferably made only on an upper end of the insulation. Also, the insulation can use both a negative type material, which is made insoluble in an etchant by photosensitive radiation, and a positive type, which is made soluble in an etchant by light.

Figure 3C:
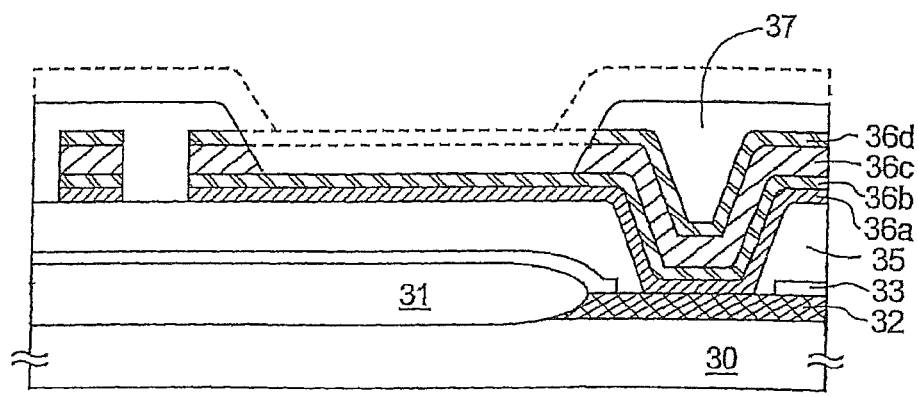

Subsequently, the first electrodes 36c, 36d are partially removed while the insulation is subjected to etching as shown in FIG. 3C. It is essential to perform etching so that an inclined surface is formed-on an exposed surface of the first electrode 36c and an exposed surface of the first electrode 36b is flattened. In the etching, dry etching or wet etching suffices to be carried out once or plural times, and a condition with a high ratio of selection is selected for the first electrode 36b and the first electrode 36c. And it is preferable that an upper end of the insulation finally have a radius of curvature of 0.2 μm to 3 μm. Also, finally, an angle (inclination, taper angle) of the inclined surface directed toward a center of the first electrode is in excess of 30° but short of 70° to reflect a light emitting from a layer containing an organic chemical compound, which is formed later.

Subsequently, a layer 38 containing an organic chemical compound is formed by means of the deposition method, or the coating method. For example, when the deposition method is used, deposition is carried out in a deposition chamber, in which evacuation is achieved until degree of vacuum becomes equal to or lower than $5 \times 10^{-3}$ Torr (0.665 Pa), preferably, reaches $10^{-4}$ to $10^{-6}$ Pa. At the time of deposition, the organic chemical compound is beforehand vaporized by resistance heating and scattered toward the substrate upon opening of a shutter at the time of deposition. The vaporized organic chemical compound is scattered upward to be deposited on the substrate through apertures provided on a metal mask. Lamination achieved by deposition forms a layer containing the organic chemical compound to present white color as a whole light emitting element.

For example, white color can be obtained by sequentially laminating $Alq_3$, $Alq_3$, p-EtTAZ, and TPD (aromatic diamine), which are partially doped with Nile red, which is a red light emitting pigment.

Also, in the case where a layer containing an organic chemical compound is formed by means of the coating method making use of spin coating, baking is preferably made by vacuum heating after coating. For example, it suffices that after a poly (ethylenedioxythiophene)/poly (styrenesulfonic acid) aqueous solution (PEDOT/PSS) acting as a hole injection layer is applied on a whole surface to be baked, a polyvinyl carbazole (PVK) solution doped with a luminescence center pigment (1,1,4,4-tetraphenyl-1,3-butadiene (TPB), 4-dicyanomethylene-2-methyl-6-(p-dimethyl-amino-styryl)-4H-bilane (DCM1), Nile red, coumarin 6, or the like) acting as a light emitting layer be applied on the whole surface to be baked.

Also, while an example, in which the organic chemical compound comprises a lamination, has been shown, the organic chemical compound can be made a monolayer. For example, a 1,3,4-oxadiazole derivative (PBD) of electron transport property may be dispersed in polyvinyl carbazole (PVK) of hole transport property. Also, white light emitting can be obtained by dispersing a 30 wt % PBD as an electron transport agent and dispersing suitable amounts of pigments of four kinds (PD, coumarin 6, DCM1, Nile red). Also, a layer made of a polymeric material and a layer made of a low molecular material may be laminated to provide the organic chemical compound. Also, the organic chemical compound layer may contain an inorganic material, for example, silicone.

Figure 2B:
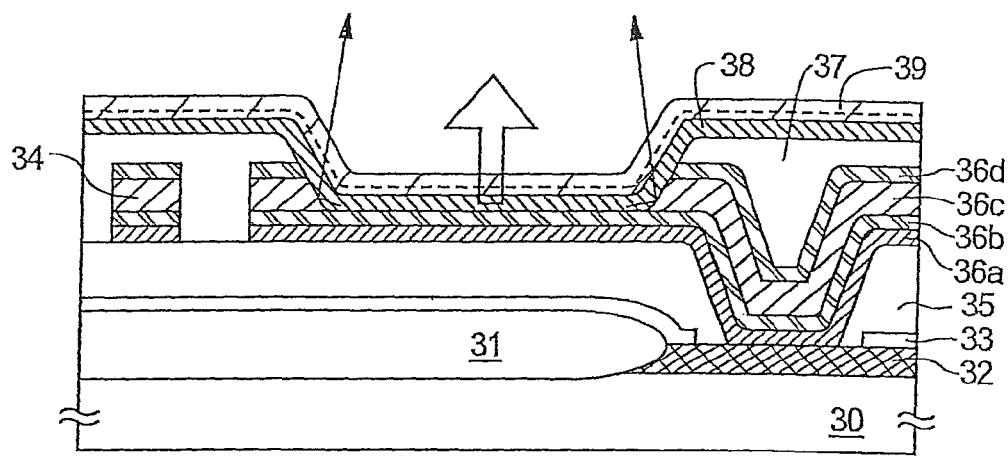

Subsequently, a thin conductive film (here, aluminum film) is deposited and laminated on a thin film (film formed by codeposition of an alloy such as MgAg, MgIn, AlLi, $CaF_2$, CaN, or the like, or an element belonging to a first group or a second group in the periodic table and an aluminum) containing a metal having a small work function (FIG. 2B). The aluminum film has a high capability of blocking moisture and oxygen and is preferably suited to a conductive film 39 in improving reliability of the light emitting device. In addition, FIG. 2B shows a cross section taken along the chain line A-A' in FIG. 2(A). The laminated film is sufficiently thin to permit passage of light emitting and functions as a cathode in the example. Also, a transparent conductive film (ITO (indium oxide stannic oxide alloy), indium oxide zinc oxide ($In_2O_3$—ZnO), zinc oxide-(ZnO), or the like) may be used in place of the thin conductive film. Also, an auxiliary electrode may be provided on the conductive film 39 in order to attain a low resistance in a cathode. Also, it suffices that at the time of formation of a cathode, resistance heating in deposition is used to selectively form the cathode with the use of a deposition mask.

The light emitting element thus obtained exhibits white light emitting in a direction indicated by an arrow in FIG. 2B, and can reflect lateral light on inclined surfaces of the first electrode 36c to increase a quantity of light emitting in directions indicated by arrows. In addition, dotted lines in FIG. 2A indicate regions, in which a field oxide film for separation of elements, or gate wirings are formed.

After formation up to the second electrode (conductive film 39) has been achieved in the above processings, a sealing substrate (transparent substrate) is stuck by a sealing agent in order to seal the light emitting element formed on the substrate 30. In addition, a spacer made of a resin film may be provided in order to ensure a spacing between the sealing substrate and the light emitting element. And an inert gas such as nitrogen or the like is filled in a space inside the scaling agent. In addition, an epoxy based resin is preferably used as the scaling agent. Also, the scaling agent is desirably a material permitting permeation of as small amount of moisture and oxygen as possible. Further, a substance (drying agent) effective in absorbing oxygen and water may be contained inside the space.

By enclosing the light emitting element in the space in the above manner, it is possible to completely isolate the light emitting element from outside and to prevent a substance, such as moisture and oxygen, which promotes deterioration of an organic chemical compound layer, from entering from outside. Accordingly, it is possible to obtain a highly reliable light emitting device.

Example 2

An explanation will be given below to an example, in which an auxiliary electrode is formed, with reference to FIGS. 6 and 7.

Figure 6A:
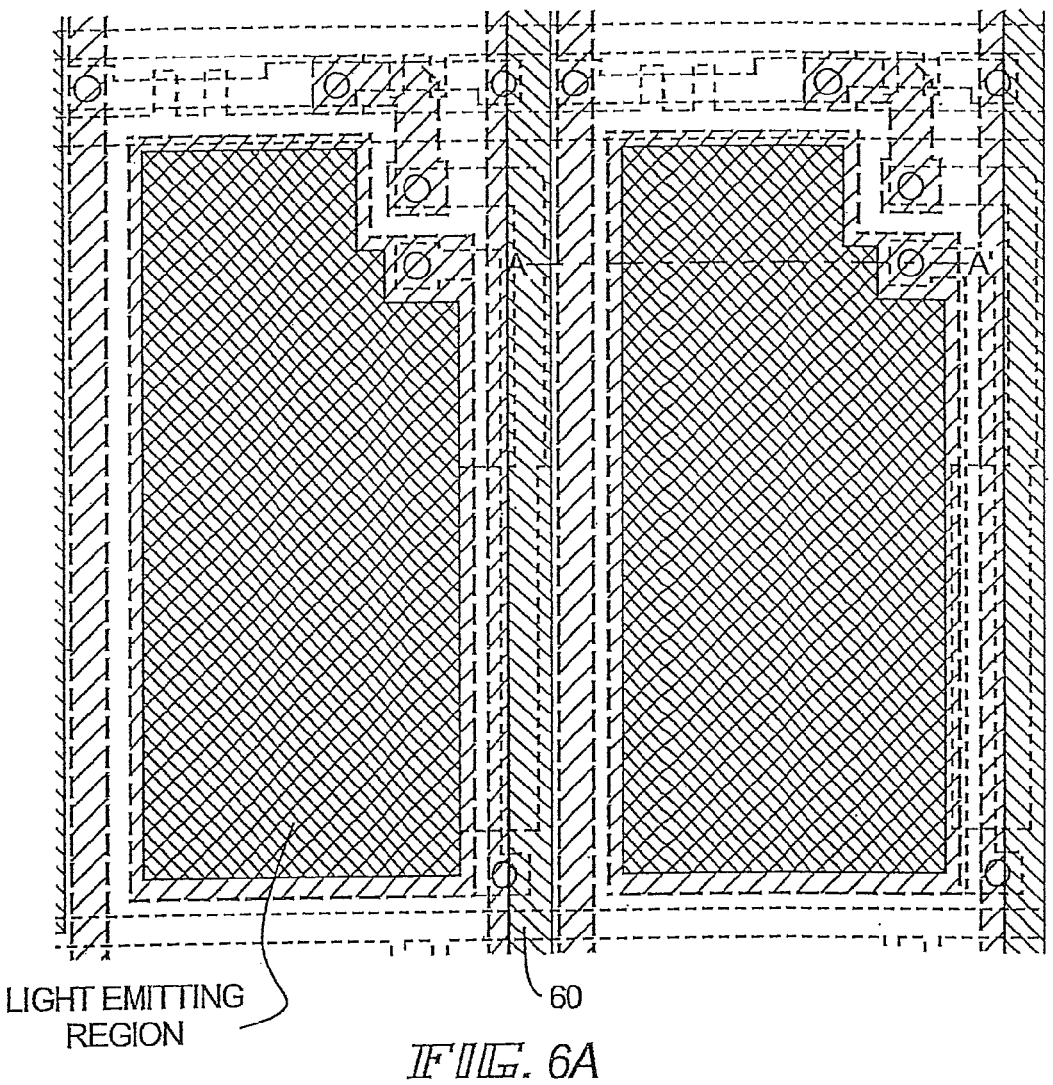
FIGS. 6A and 6B are views showing an example 2.
Figure 6B:
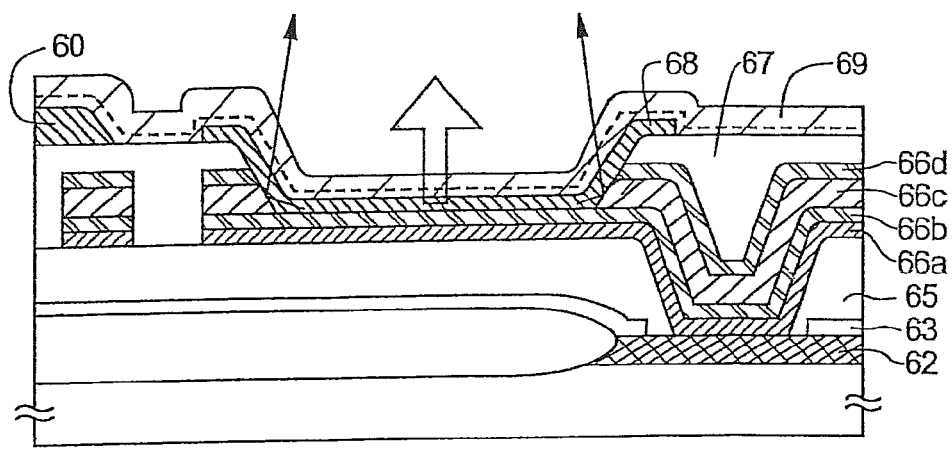
Figure 7:
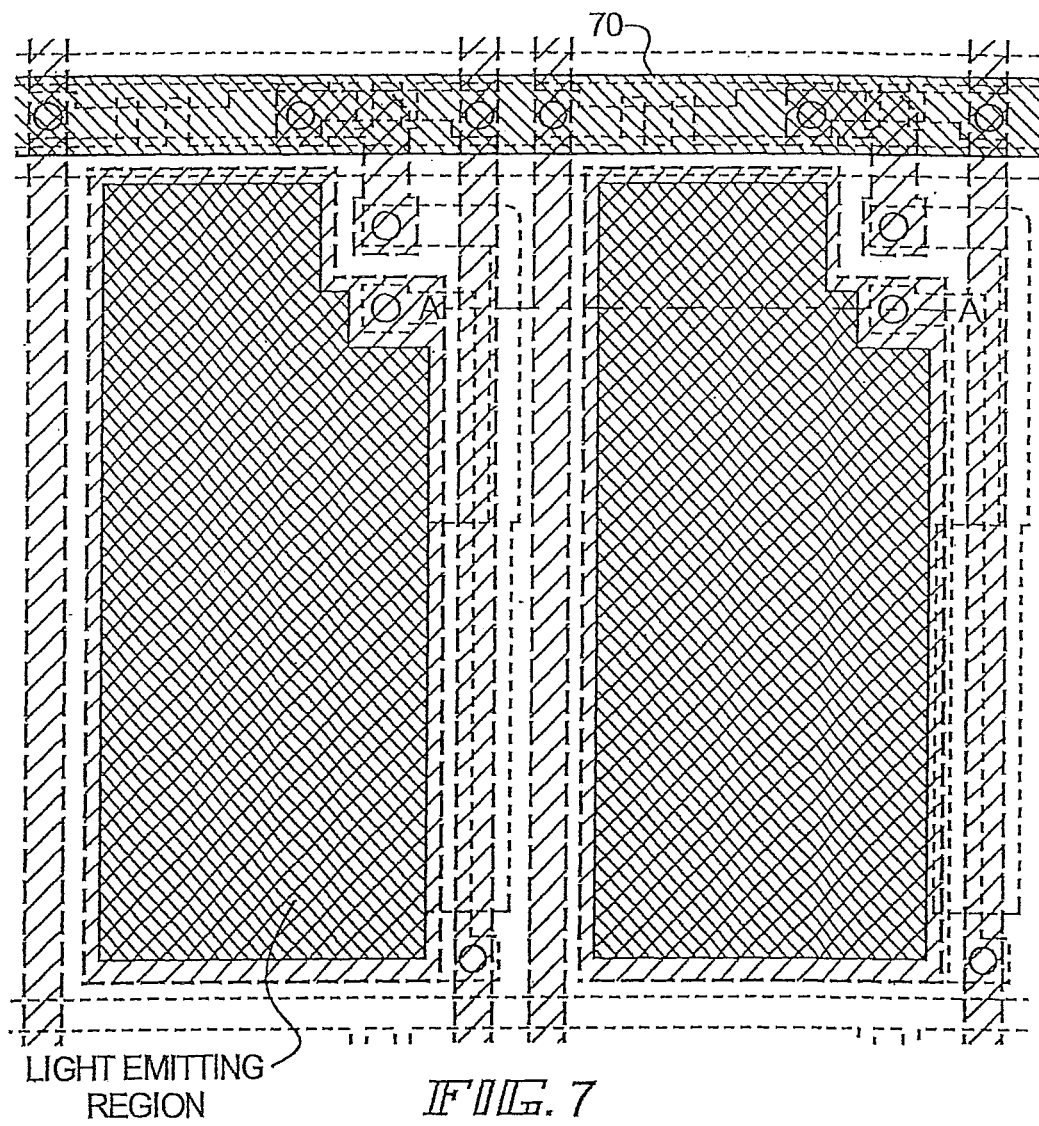
FIG. 7 is a view showing an example 2.

FIG. 6A is a top plan view showing pixels, and FIG. 6B is a cross sectional view taken along the chain line A-A'.

Processings for forming so far as an insulation 67 are the same as those in the Example 1, and so are omitted here. The insulation 37 in FIG. 2B corresponds to the insulation 67 in FIG. 6B.

In accordance with the Example 1, a field oxide film, drain region 62, interlayer insulating films 63, 65, first electrodes 66a to 66d, and the insulation 67 are formed on a substrate having an insulating surface.

Subsequently, a layer 68 containing an organic chemical compound is selectively formed. In the example, the layer 68 containing an organic chemical compound is selectively formed by means of the deposition method, in which a deposition mask is used, or the ink jet method.

Subsequently, an auxiliary electrode 60 is selectively formed on the insulation 67 by means of the deposition method, in which a deposition mask is used. The auxiliary electrode 60 suffices to be set to have a film thickness ranging from 0.2 µm to 0.5 µm. In the example, the auxiliary electrode 60 is shown in FIG. 6A as being arranged in a Y-direction, but such arrangement is not specifically limitative but may be such that an auxiliary electrode 70 is arranged in a X-direction as shown in FIG. 7. In addition, a cross sectional view taken along the chain line A-A' shown in FIG. 7 is the same as that in FIG. 2B.

Subsequently, a thin conductive film (here, aluminum film) 69 is deposited and laminated on a thin film (film formed by codeposition of an alloy such as MgAg, MgIn, AlLi, $CaF_2$, CaN, or the like, or an element belonging to a first group or a second group in the periodic table and an aluminum) containing a metal having a small work function, in the same manner as in the Example 1. The laminated film is sufficiently thin to permit passage of light emitting and functions as a cathode in the example. Also, a transparent conductive film (ITO (indium oxide stannic oxide alloy), indium oxide zinc oxide ($In_2O_3$—ZnO), zinc oxide (ZnO), or the like) may be used in place of the thin conductive film. Also, in the example, the auxiliary electrode 60 is provided on the insulation 67 in a manner to contact with the thin conductive film 69 in order to attain a low resistance in a cathode.

The light emitting element thus obtained exhibits white light emitting in a direction indicated by an arrow in FIG. 6B, and can reflect lateral light emitting on inclined surfaces of a first electrode 66c to increase a quantity of light emitting in directions indicated by arrows.

Also, since formation of the auxiliary electrodes 60, 70 in the example materializes a low resistance in a cathode, the example can be applied to a device having a large-sized pixel section.

Also, in the example, the auxiliary electrode 60 is formed after the layer 68 containing an organic chemical compound is formed, but such order of formation is not specifically limitative but the layer containing an organic chemical compound may be finned after the auxiliary electrode 60 is formed.

Also, the example can be freely combined with any one of the first to third embodiments and the example 1.

Example 3

An explanation will be given to this example with reference to FIGS. 9A and 9B being a view showing an outward appearance of a whole light emitting device of an active matrix type. In addition, FIG. 9A is a top plan view showing a light emitting device, and FIG. 9B is a cross sectional view taken along the line A-A' in FIG. 9A. The reference numeral 901 denotes a source signal conductor driving circuit indicated by dotted lines, 902 a pixel section, and 903 a gate signal conductor driving circuit. Also, the reference numeral 904 denotes a sealed substrate, and 905 a sealing agent, an interior surrounded by the sealing agent 905 defining a space 907. Also, the reference numerals 930a, 930b denote IC chips mounted on a semiconductor substrate 910 by means of the COG (chip on glass) method, wire bonding method, or the TAB (tape automated bonding) method.

Figure 8:
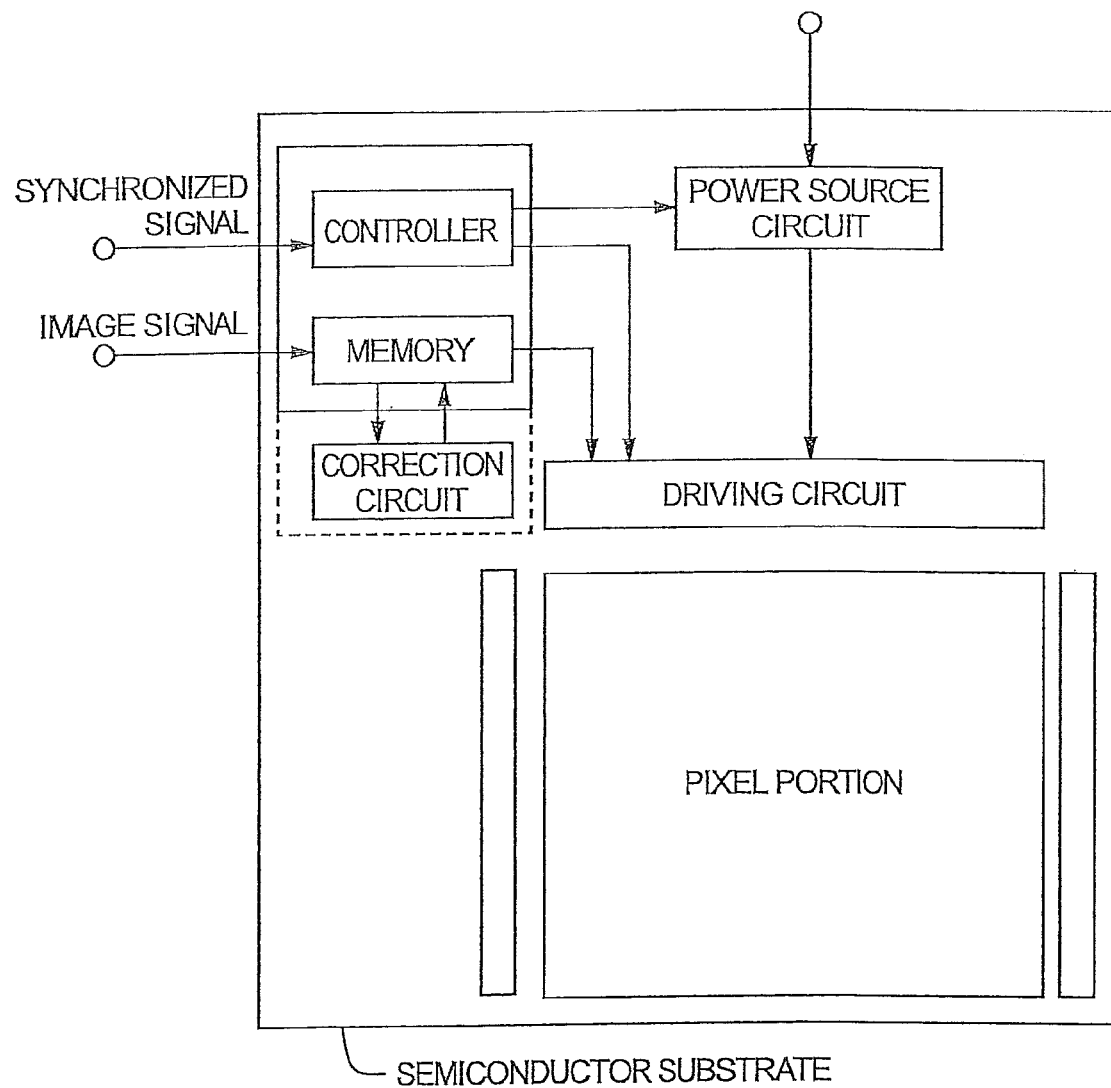
FIG. 8 is a system block diagram of a semiconductor device comprising a light emitting device.

While FIG. 9A shows mounting of IC chips provided with a memory, CPU, D/A converter, or the like, the invention uses a semiconductor substrate as a substrate, so that it is possible to form a complex integrated circuit (memory, CPU, D/A converter, or the like) on the same substrate. FIG. 8 is a system block diagram of a semiconductor device in the form of a portable type information terminal such as PDA, in which various circuits are fabricated on a semiconductor substrate.

A circuit mounted on a semiconductor device shown in FIG. 8 comprises a power source circuit composed of a stabilized power source and an op-amp of high speed and high accuracy, controller, memory, correction circuit, or the like. Further, a CPU can be fabricated on the same substrate, and information processed in the CPU is output as an image signal a data signal to a controller from an image signal processing circuit. The controller functions to convert an image signal and clock into respective timing specifications of a data signal side driving circuit and a gate signal side driving circuit.

Concretely, the controller functions to divide a image signal into data corresponding to respective pixels in a display and to convert a horizontal synchronizing signal and a vertical synchronizing signal, which are input from outside, into a start signal for the driving circuits and a timing control signal for ac conversion of an internal power circuit.

It is demanded for portable type information terminals such as PDA to be usable outdoors and in the train for a long time with a chargeable type battery as a power source without being connected to an AC receptacle. Also, it is simultaneously demanded for such electronic device to be made lightweight and small in size with importance being attached to easiness in carrying. Being increased in capacity, a battery having a major part of a weight of an electronic device will be increased in weight. Accordingly, in order to decrease power consumption of such an electronic device, there is a need of taking measures in the software aspect, such as control on time, in which a backlight is put on, and setting of a standby mode.

For example, when no input signal is input into a CPU, a standby mode comes out to synchronously suspend a part of operations. In the pixel section, EL elements are damped in light emitting intensity, or displaying of a picture itself is stopped. Alternatively, measures are taken such that memory elements are fabricated in respective pixels and switching to a mode of displaying a still picture is made. In this manner, it is possible to decrease power consumption of the electronic device.

Also, in order to display a still picture, reduction in power consumption can be achieved by suspending the functions of an image signal processing circuit of a CPU, VRAM, and so on.

In addition, the reference numeral 908 denotes a wiring for transmission of a signal input into the source signal line driving circuit 901 and the gate signal line driving circuit 903, through which wiring a video signal and a clock signal are received from a FPC (flexible print circuit) being an external input terminal. In addition, while only the FPC is shown, a printed wire board (PWB) may be mounted to the FPC. In the specification of the present application, the light emitting device includes not only a light emitting device itself but also a light emitting device in a state, in which a FPC or a PWB is mounted thereon.

Subsequently, an explanation will be given to a cross-sectional structure with reference to FIG. 9B. A driving circuit and a pixel section are formed on the semiconductor substrate 910, and here the source signal conductor driving circuit 901 as a driving circuit and the pixel section 902 are shown.

In addition, the source signal conductor driving circuit 901 comprises a CMOS circuit, in which an n-channel type FET 923 and a p-channel type FET 924 are combined together. Also, TFTs composing the driving circuit may be formed by a known CMOS circuit, PMOS circuit, or a NMOS circuit. Also, while the example presents a driver integrated type, in which a driving circuit is formed on a substrate, the driving circuit is not necessarily required to be formed on the substrate, but can be formed outside the substrate.

Also, the pixel section 902 is formed by a plurality of pixels including a switching FET 911, a current control FET 912, and a first electrode (anode) 913 electrically connected to a drain of the FET.

Also, insulations 914 are formed on both ends of the first electrode (anode) 913, and the first electrode partially comprises inclined surfaces along sides of the insulations 914. The inclined surfaces of the first electrode are formed simultaneously with formation of the insulations 914. The inclined surfaces reflect a light, emitted from a layer 915 containing an organic chemical compound, to increase a quantity of luminescence in directions indicated by an arrow in FIG. 9.

Also, the layer 915 containing an organic chemical compound is selectively formed on the first electrode (anode) 913. Further, a second electrode (cathode) 916 is formed on the layer 915 containing an organic chemical compound. Thereby, a light emitting element 918 composed of the first electrode (anode) 913, the layer 915 containing an organic chemical compound, and the second electrode (cathode) 916 is formed. Here, since the light emitting element 918 is white light emitting in the example, a color filter (here, an overcoat layer is not shown for the sake of simplicity) composed of a color layer 931 and a BM 932 is provided.

Also, a third electrode (auxiliary electrode) 917 constituting a part of the configuration shown in the Example 2 is formed on the insulations 914 to materialize a decrease in resistance of the second electrode. Also the second electrode (cathode) 916 also functions as a wiring common to all pixels to be connected electrically to a FPC 909 via the third electrode 917 and the connection wiring 908.

Also, in order to seal the light emitting element 918 formed on the semiconductor substrate 910, the sealing agent 905 is used for attachment of the sealing substrate 904. In addition, a spacer made of a resin film may be provided in order to ensure a spacing between the sealing substrate 904 and the light emitting element 918. And an inert gas such as nitrogen or the like is filled in a space 907 inside the sealing agent 905. In addition, an epoxy based resin is preferably used as the sealing agent 905. Also, the sealing agent 905 is desirably a material permitting permeation of as small moisture and oxygen as possible. Further, a substance effective in absorbing oxygen and water may be contained inside the space 907.

Also, it is possible in the example to use, in addition to a glass substrate and a quartz substrate, a plastic substrate made of FRP (Fiberglass-Reinforced Plastics), PVF (polyvinylfluoride), myler polyester, acrylic, or the like, as a material that constitutes the sealing substrate 904. Also, after the sealing agent 905 is used for adhesion of the scaling substrate 904, sealing with the sealing agent can be made so as to cover sides (exposed surfaces).

By enclosing the light emitting element in the space 907 in the above manner, it is possible to completely isolate the light emitting element from outside and to prevent a substance, such as moisture and oxygen, which promotes deterioration of an organic chemical compound layer, from entering from outside. Accordingly, it is possible to obtain a highly reliable light emitting device.

Also, the example can be freely combined with any one of the first to third embodiments, the example 1 and the example 2.

Example 4

By embodying the invention, all electronic equipments are completed, which incorporate a module (active matrix type EL module) having a light emitting element.

Such electronic equipments include a video camera, digital camera, head-mount display (goggle type display), car navigation, car stereo, personal computer, portable information terminal (mobile computer portable telephone, or electronic book, or the like). FIGS. 10A to 10F, 11A, and 11B show example of such electronic equipments.

Figure 10A:
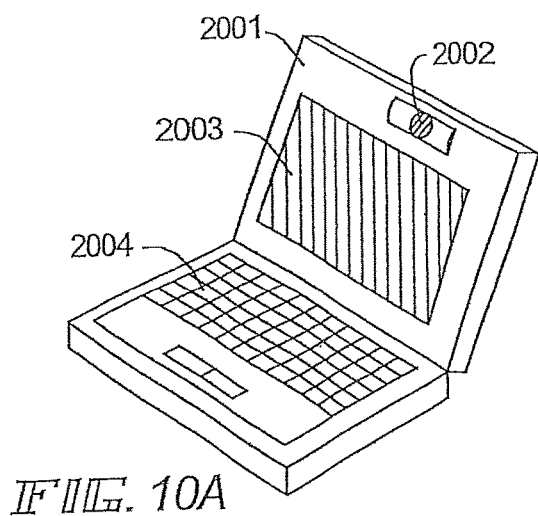
FIGS. 10A to 10F are views showing example of electronic equipments.

FIG. 10A shows a personal computer including a body 2001, image input unit 2002, display unit 2003, a keyboard 2004, and so on. However, the invention uses a semiconductor substrate (for example, a wafer having a diameter of 300 mm), and so screen sizes are small or medium.

Figure 10B:
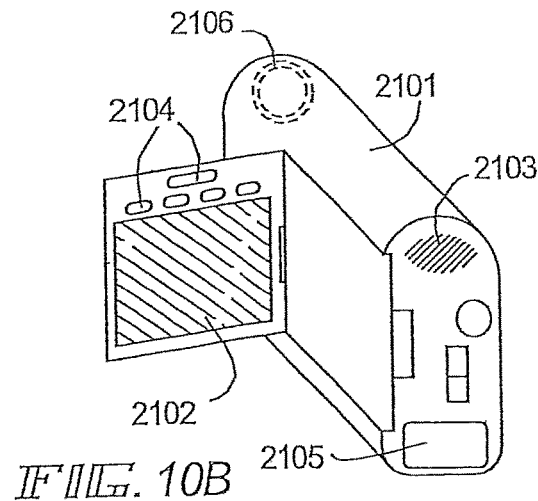

FIG. 10B shows a video camera including a body 2101, display unit 2102, sound input unit 2103, control switches 2104, battery 2105, an image receiving 2106, and so on.

Figure 10C:
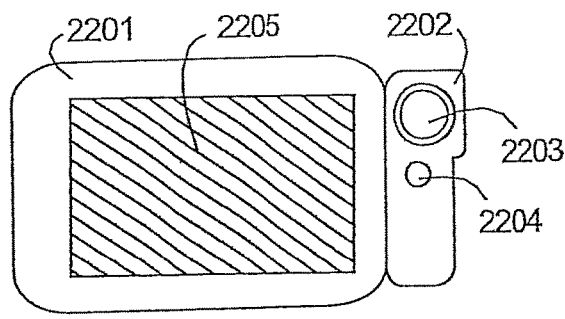

FIG. 10C shows a mobile computer including a body 2201, camera unit 2202, image receiving unit 2203, control switch 2202, a display unit 2303, and so on.

Figure 10D:
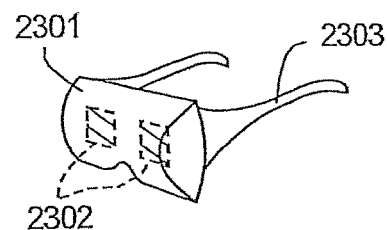

FIG. 10D shows a goggle type display including a body 2301, display unit 2302, arms 2203, and so on.

Figure 10E:
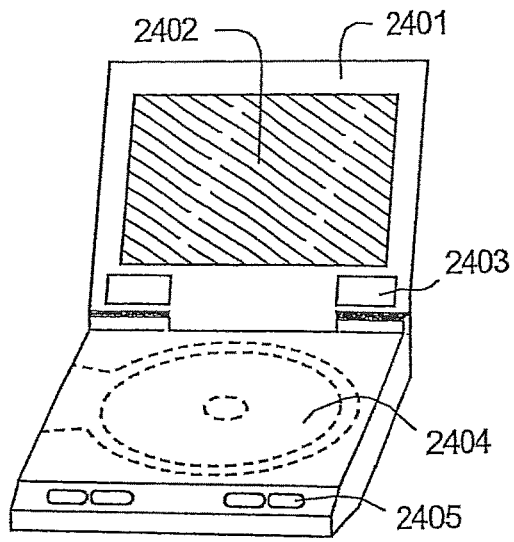

FIG. 10E shows a player making use of a recording medium (referred below to as recording medium), in which programs are recorded, and including a body 2401, display unit 2402, speaker unit 2403, recording medium 2404, control switches 2405, and so on. In addition, the player enables appreciation of music, appreciation of movie, games, and Internet with the use of DVD (Digital Versatile Disc), CD, or the like as a recording medium.

Figure 10F:
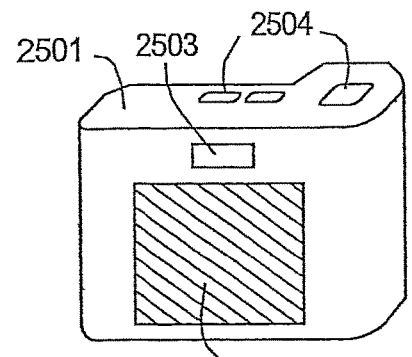

FIG. 10F shows a digital camera including a body 2501, display unit 2502, eyepiece unit 2503, control switches 2504, image receiving unit (not shown), and so on.

Figure 11A:
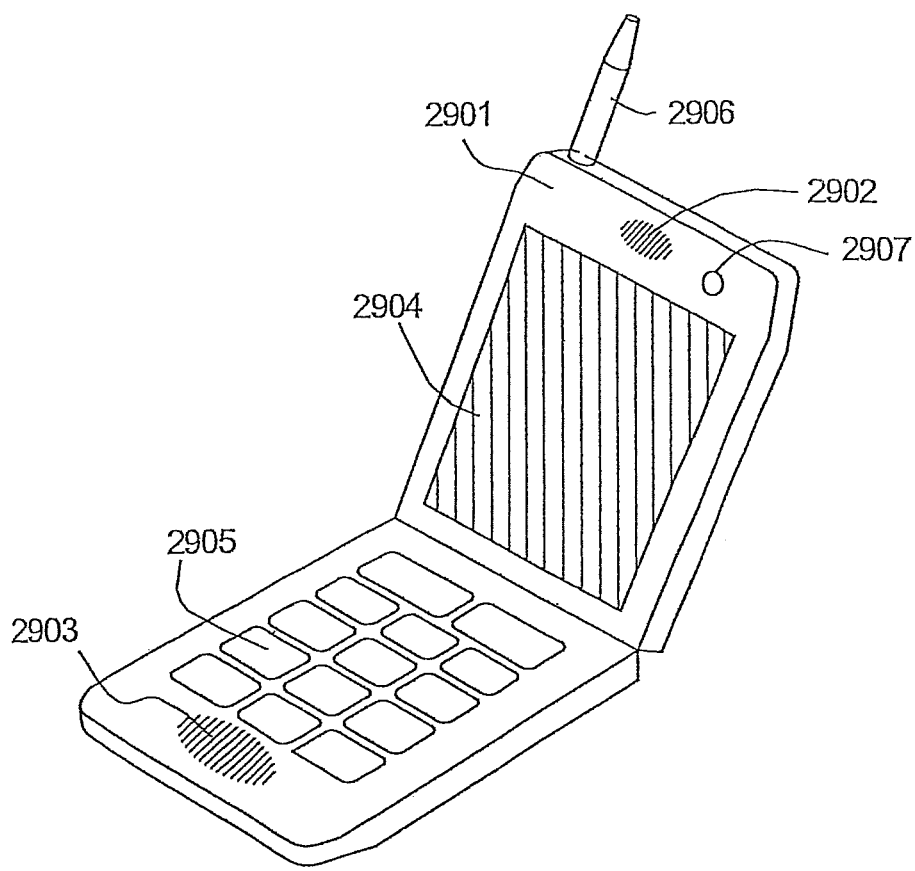
FIGS. 11A and 11B are views showing example of electronic equipments.

FIG. 11A shows a portable telephone including a body 2901, sound output unit 2902, sound input unit 2903, display unit 2904, control switches 2905, antenna 2906, image input unit (CCD, image sensor, or the like) 2907.

Figure 11B:
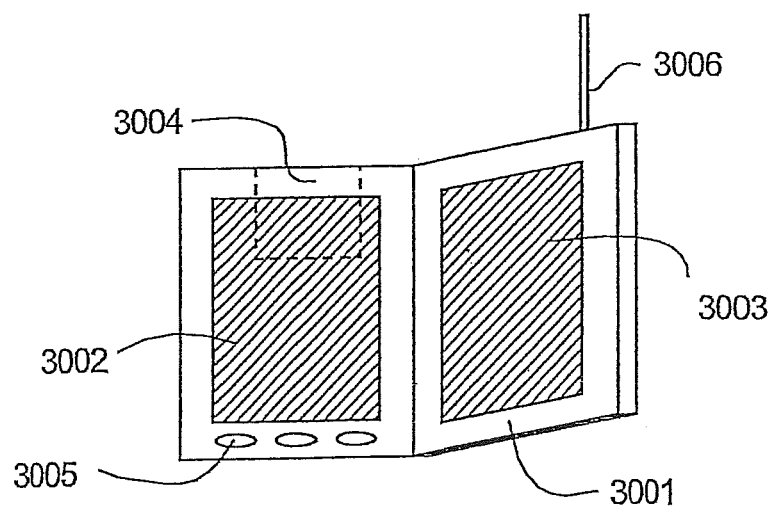
Figure 12:
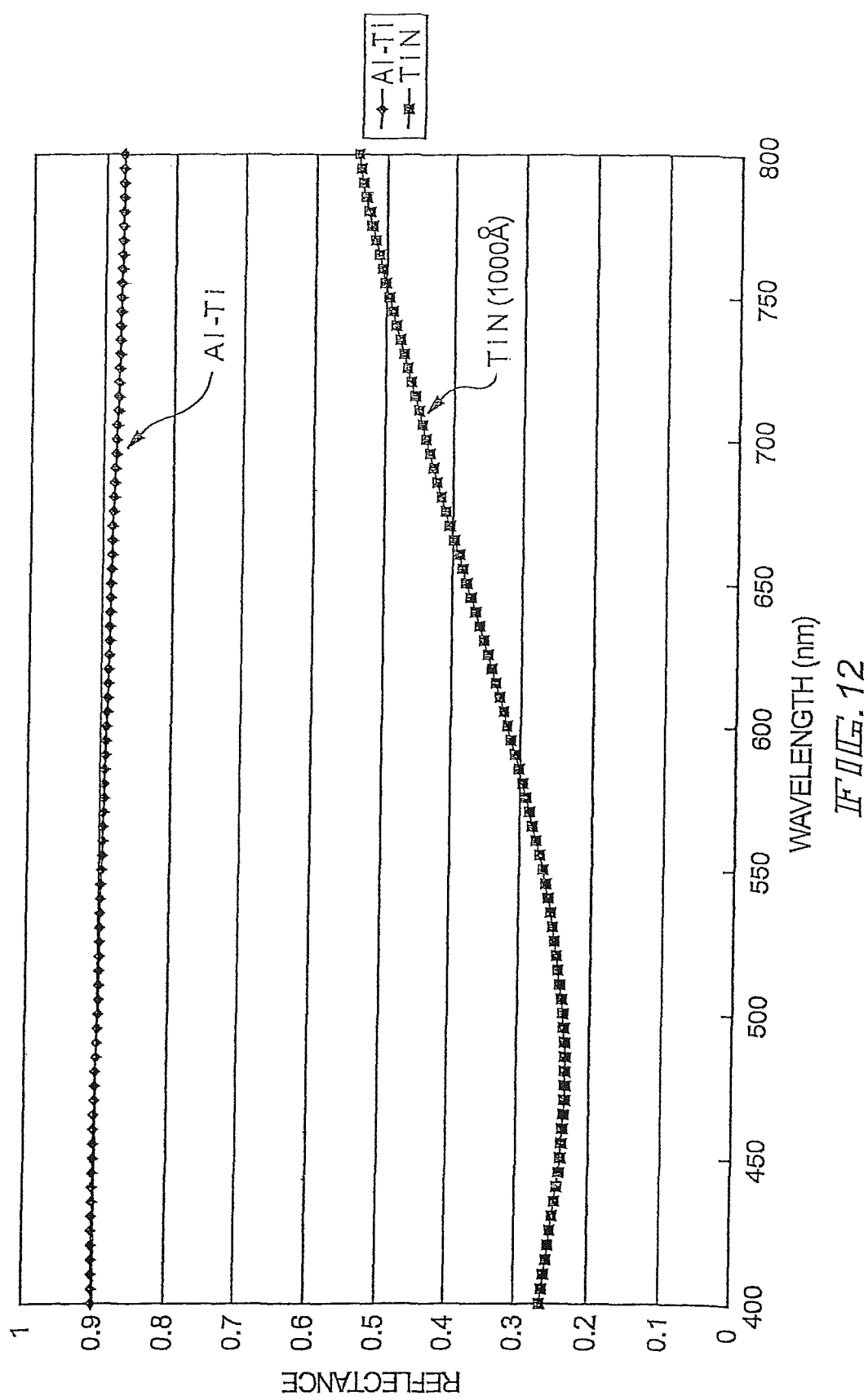
FIG. 12 is a graph indicating reflectance of an aluminum film containing a very small amount of Ti and reflectance of a TiN film (100 nm)
Figure 13:
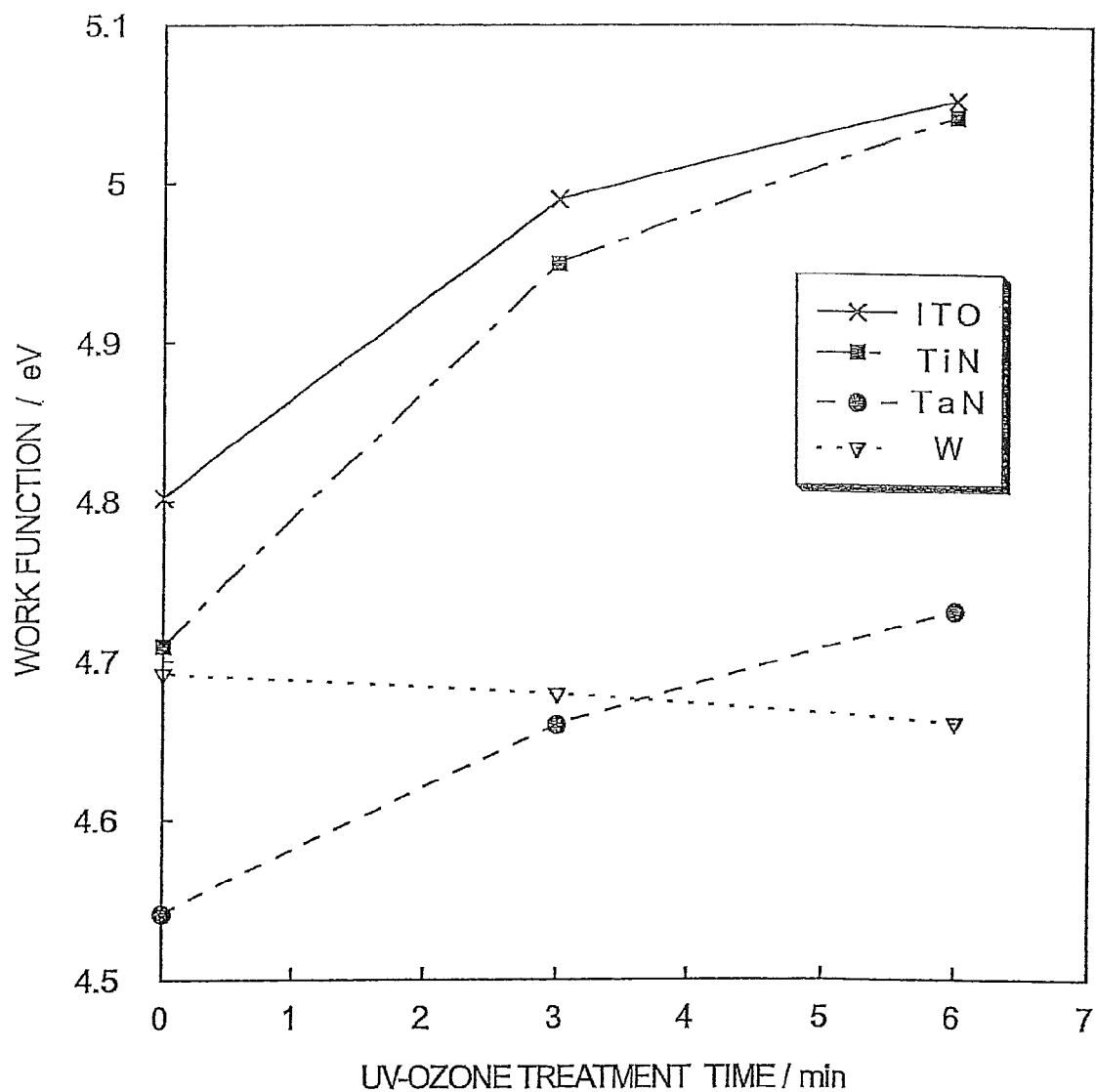
FIG. 13 is a graph indicating changes in work function with UV ozonization time.

FIG. 11B shows a portable book (electronic book) including a body 3001, display units 3002, 3003, recording medium 3004, control switches 3005, an antenna 3006, and so on.

As described above, the invention is applied to a very wide range of applications and applicable to methods of fabricating electronic equipments in all fields. Also, the electronic equipments in the example can be also materialized with the use of configurations of any combinations of the first to third embodiments and the Examples 1 to 3.

According to the invention, a light emitting in a lateral direction (direction parallel to a substrate surface) among a light emitted from a layer containing an organic chemical compound is reflected by inclined surfaces, which are formed on stepped portions of a first electrode, whereby a total quantity of luminescence taken out in a certain direction (direction passing through the second electrode) can be increased. That is, it is possible to materialize a light emitting element involving less loss, such as stray light, in luminescence.

Also, according to the invention, heat generated when a light emitting element is driven is dissipated through a semiconductor substrate, and so it is possible to materialize a light emitting element of high reliability.

Also, various circuits in addition to the light emitting element can be integrated on a semiconductor substrate to achieve a great miniaturization of a semiconductor device.

The invention claimed is:

1. A display module comprising:
    a light emitting device comprising:
        a single crystal semiconductor substrate;
        a substrate over the single crystal semiconductor substrate;
        a pixel portion comprising a light emitting element and a first transistor electrically connected to the light emitting element, the light emitting element between the single crystal semiconductor substrate and the substrate, the light emitting element comprising:
            a first electrode over the single crystal semiconductor substrate;
            an EL layer over the first electrode; and
            a second electrode over the EL layer;
        a sealing agent between the single crystal semiconductor substrate and the substrate; and
        a wiring over the single crystal semiconductor substrate, the wiring electrically connected to the pixel portion; and
    a flexible printed circuit bonded to the wiring,
    wherein the EL layer is in contact with the first electrode in a light emitting region of the light emitting element,
    wherein a thickness of the first electrode in a region except the light emitting region is larger than a thickness of the first electrode in the light emitting region,
    wherein the first transistor comprises a channel formation region in the single crystal semiconductor substrate, and
    wherein the EL layer is capable of emitting white light.

2. The display module according to claim 1,
    wherein the light emitting device further comprises a color layer on the substrate, and
    wherein the color layer and the light emitting region of the light emitting element overlaps with each other.

3. The display module according to claim 1, further comprising:
    an insulating film covering the first electrode except in the light emitting region,
    wherein the EL layer is over and in contact with the insulating film.

4. The display module according to claim 1, further comprising:
    a sealing material between the single crystal semiconductor substrate and the substrate,
    wherein the sealing material surrounds the pixel portion.

5. The display module according to claim 1, wherein the substrate is a glass substrate.

6. The display module according to claim 5, further comprising an IC chip.

7. An electronic equipment comprising the display module according to claim 5, wherein the electronic equipment is one selected from the group consisting of a video camera, a digital camera, a head-mount display, a car navigation, a DVD player, an electronic game equipment, a portable information terminal and a personal computer.

8. An electronic device comprising:
    a light emitting device comprising:
        a single crystal semiconductor substrate;
        a substrate over the single crystal semiconductor substrate;
        a pixel portion comprising a light emitting element and a first transistor electrically connected to the light emitting element, the light emitting element between the single crystal semiconductor substrate and the substrate, the light emitting element comprising:
            a first electrode over the single crystal semiconductor substrate;
            an EL layer over the first electrode; and
            a second electrode over the EL layer;
        a sealing agent between the single crystal semiconductor substrate and the substrate; and
        a wiring over the single crystal semiconductor substrate, the wiring electrically connected to the pixel portion;
    a flexible printed circuit bonded to the wiring; and
    a control switch;
    wherein the EL layer is in contact with the first electrode in a light emitting region of the light emitting element,
    wherein a thickness of the first electrode in a region except the light emitting region is larger than a thickness of the first electrode in the light emitting region,
    wherein the first transistor comprises a channel formation region in the single crystal semiconductor substrate, and
    wherein the EL layer is capable of emitting white light.

9. The electronic device according to claim 8, further comprising an image receiving unit.

10. The electronic device according to claim 8, wherein the substrate is a glass substrate.

11. The electronic device according to claim 8, the light emitting device further comprising:
    a sealing material between the single crystal semiconductor substrate and the substrate,
    wherein the sealing material surrounds the pixel portion.

12. The electronic device according to claim 8, further comprising a battery.

13. The electronic device according to claim 8, further comprising an IC chip.

14. The electronic device according to claim 9, further comprising a camera unit.

15. The electronic device according to claim 9, further comprising an eyepiece unit.

16. The electronic device according to claim 9, further comprising an image input unit.

17. The electronic device according to claim 16, wherein the image input unit is an image sensor.

18. The display module according to claim 1,
    wherein the light emitting device further comprises a driver circuit electrically connected to the pixel portion via the wiring,
    wherein the driver circuit comprises a second transistor, and wherein the second transistor comprises a channel formation region in the single crystal semiconductor substrate.

19. The display module according to claim 18, further comprises
a controller circuit; and
a D/A converter,
wherein the controller circuit and the D/A converter are fabricated on the single crystal semiconductor substrate.

20. The electronic device according to claim 8,
wherein the light emitting device further comprises a driver circuit electrically connected to the pixel portion via the wiring,
wherein the driver circuit comprises a second transistor, and
wherein the second transistor comprises a channel formation region in the single crystal semiconductor substrate.

21. The electronic device according to claim 20, further comprises
a controller circuit; and
a D/A converter,
wherein the controller circuit and the D/A converter are fabricated on the single crystal semiconductor substrate.

* * * * *